(12) United States Patent
Higashi et al.

(10) Patent No.: US 6,638,687 B2
(45) Date of Patent: Oct. 28, 2003

(54) METHOD FOR PREPARING LITHOGRAPHIC PRINTING PLATE

(75) Inventors: Tatsuji Higashi, Shizuoka-ken (JP); Yasuo Okamoto, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 102 days.

(21) Appl. No.: 10/003,229

(22) Filed: Dec. 6, 2001

(65) Prior Publication Data

US 2003/0049564 A1 Mar. 13, 2003

(30) Foreign Application Priority Data

Dec. 8, 2000 (JP) ........................................ 2000-374933

(51) Int. Cl.$^7$ .............................. G03F 7/038; G03F 7/32
(52) U.S. Cl. ................ 430/302; 430/278.1; 430/284.1; 430/286.1; 430/287.1; 430/288.1; 430/348; 430/434; 430/494
(58) Field of Search ........................... 430/270.1, 278.1, 430/281.1, 284.1, 286.1, 287.1, 288.1, 302, 348, 434, 494, 944, 945, 964

(56) References Cited

U.S. PATENT DOCUMENTS

| | | | |
|---|---|---|---|
| 3,615,480 A | | 10/1971 | Frank |
| 4,983,498 A | * | 1/1991 | Rode et al. .................. 430/284 |
| 5,085,974 A | * | 2/1992 | Frass et al. ............... 430/284.1 |
| 6,364,544 B1 | * | 4/2002 | Sasayama et al. .......... 396/578 |
| 6,514,668 B1 | * | 2/2003 | Tsuji et al. .............. 430/278.1 |
| 2002/0081527 A1 | * | 6/2002 | Kondo ........................ 430/302 |

FOREIGN PATENT DOCUMENTS

| | | |
|---|---|---|
| EP | 0 080 042 A1 | 6/1983 |
| EP | 0 949 540 A1 | 10/1999 |

\* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A method for preparing a lithographic printing plate involving the steps of subjecting, to imagewise exposure, a pre-sensitized plate for use in making a lithographic printing plate comprising an aluminum substrate provided thereon with a light-sensitive layer formed from a photopolymerizable light-sensitive composition, which comprises a compound having an ethylenically unsaturated double bond, a photopolymerization initiator and a polyurethane resin binder and then developing the imagewise exposed plate with a developer containing an inorganic alkaline agent and a nonionic surfactant, carrying a polyoxyalkylene ether group, having a pH value ranging from 10.0 to 12.5 and an electrical conductivity ranging from 3 to 30 mS/cm.

11 Claims, No Drawings

METHOD FOR PREPARING LITHOGRAPHIC PRINTING PLATE

DETAILED EXPLANATION OF THE INVENTION

1. Industrial Field of the Invention

The present invention relates to a method for preparing a lithographic printing plate. More specifically, the present invention pertains to a method for processing a lithographic printing plate, which can control the reduction of developing properties due to the elapse of time and/or the repeated use, hardly forms any sludge even when developing a large number of printing plates, can ensure a good ability of developing nonimage areas and can provide a printing plate free of any scumming during printing operations. Moreover, the present invention further relates to a method for processing a lithographic printing plate, which never causes any trouble or accident such as blinding, scarcely damages image areas during development, can provide an image having high strength and is capable of realizing high printing durability.

2. Prior Art

The negative-working presensitized plate for use in making a lithographic printing plate, which has widely been used, comprises a hydrophilized aluminum plate provided thereon with a diazo resin layer and therefore, an organic solvent should be used as a developing liquid. For this reason, the developing waste liquor must be post-treated and it would be feared that the waste liquor might adversely affect the environment. Alternatively, the positive-working presensitized plate for use in making a lithographic printing plate comprises, in its light-sensitive layer, an o-quinone diazide compound in combination with a novolak resin and accordingly, the developer therefor comprises an aqueous alkaline silicate solution capable of dissolving the novolak resin. However, the pH value of the solution capable of dissolving the novolak resin is on the order of about 13. A developer having such a high pH value is highly irritative when it is adhered to the skin or the mucous and therefore, sufficient care should be necessary when handling the same.

On the other hand, there has also been used a photopolymerizable presensitized plate for use in making a lithographic printing plate comprising an aluminum substrate provided thereon with a photopolymerizable light-sensitive layer and there have been proposed, as a developer therefor, aqueous solutions of, for instance, silicates, phosphates, carbonates and hydroxides of alkali metals and organic amine compounds.

For instance, Japanese Un-Examined Patent Publication (hereunder referred to as "J.P. KOKAI") No. Hei 8-248643 discloses a developer containing an alkali silicate and an amphoteric surfactant and having a high pH value of not less than 12 and J.P. KOKAI No. Hei 11-65129 discloses a developer containing an alkali silicate having a pH value of not more than 12, in which the ratio: $SiO_2/M_2O$ (M represents an alkali metal) is specified.

The former suffers from such a problem that image areas are susceptible to damages during development because of the high pH value of the developer in addition to the foregoing problem of handling and the latter suffers from a problem in that the silicate is insolubilized through gelation due to only a slight pH reduction of the developer during using the same.

As developers free of any alkali silicate, J.P. KOKAI No. Sho 61-109052 disclosed those comprising, for instance, alkaline agents, chelating agents, anionic surfactants, emulsifying agents and n-alkanes and West German Patent No. 1,984,605 disclosed those comprising alkaline agents, chelating agents, anionic surfactants, amyl alcohol and N-alkoxyamines. However, the developers have extremely high pH values and contain organic solvents. Therefore, image areas would be greatly damaged and there are some problems to be solved in order to obtain sufficient printing characteristics such as printing durability.

As developers having a relatively low pH values (not more than 12) and free of any alkali silicate, J.P. KOKAI No. 2000-81711 discloses a developer consisting of an aqueous potassium hydroxide solution containing an anionic surfactant and J.P. KOKAI No. Hei 11-65126 discloses a developer consisting of an aqueous solution of an alkali metal carbonate having a pH value ranging from 8.5 to 11.5.

However, such a developer having a relatively low pH value is fundamentally insufficient in the ability of solubilizing the photopolymerizable light-sensitive layer and therefore, problems arise such that undeveloped residue remains on the printing plate after the development since the development does not sufficiently proceed when using a printing plate material stored over a long period of time prior to the development and that sludge is generated during the development. Some consideration is needed to solve these problems. For instance, the developing ability should be improved by increasing the acid value of a polymeric binder incorporated into the light-sensitive layer of the plate material or a monomer carrying an acidic group is used in combination. If such a binder having a high acid value is used, however, problems concerning printing frequently arise such that ink is not adhered to the printing plate in the course of the printing operation (a problem of blinding) and that image areas are damaged by the action of the developer to thus reduce the printing durability of the resulting printing plate.

PROBLEMS THAT THE INVENTION IS TO SOLVE

Accordingly, it is an object of the present invention to provide a method for processing a lithographic printing plate, which makes use of an alkaline developer having a low pH value favorable from the viewpoint of the environmental protection and safety, which is not accompanied by the formation of any sludge in the developer even if the developer is used over a long period of time, which ensures a good ability of developing nonimage areas, which can provide a printing plate free of any scumming in printing operation and never accompanied by any trouble such as blinding during printing operations, which scarcely damages image portions during development, which can provide images having high strength and which can provide a printing plate having high printing durability.

MEANS FOR SOLVING THE PROBLEMS

The inventors of this invention have conducted various studies to solve the foregoing problems associated with the conventional techniques, have found that if an alkali solution having a relatively low pH value is used in combination with a nonionic surfactant having a specific structure and a salt concentration in the developer is adjusted, the unexposed area of a photopolymerizable light-sensitive layer comprising a polyurethane resin binder is dissolved at an improved dissolution speed, while the penetration of the developer into the exposed portion or the portion crosslinked through photopolymerization is conversely inhibited and have thus completed the present invention.

According to the present invention, there is thus provided a method for preparing a lithographic printing plate comprising the steps of subjecting, to imagewise exposure, a presensitized plate for use in making a lithographic printing plate comprising an aluminum substrate provided thereon with a light-sensitive layer formed from a photopolymerizable light-sensitive composition, which comprises a compound having an ethylenically unsaturated double bond, a photopolymerization initiator and a polyurethane resin binder and then developing the image-exposed plate with a developer containing an inorganic alkaline agent and a nonionic surfactant, carrying a polyoxyalkylene ether group, and having a pH value ranging from 10.0 to 12.5 and an electrical conductivity ranging from 3 to 30 mS/cm.

The present invention thus permits the stable production of a printing plate, which comprises unexposed areas free of any scumming and exposed areas having a high printing durability.

BEST MODE FOR CARRYING OUT THE INVENTION

The method for processing a lithographic printing plate according to the present invention will hereunder be described in more detail.

We first describe the novel developer used in the processing method of the present invention. The use of such a developer is one of the characteristic properties of the present invention.

The developer used in the method for processing a lithographic printing plate according to the present invention is an aqueous solution containing an inorganic alkaline agent and a nonionic surfactant carrying a polyoxyalkylene ether group, the pH value thereof ranges from 10.0 to 12.5 and the electrical conductivity thereof ranges from 3 to 30 mS/cm.

Any inorganic alkaline agent may appropriately be used inasmuch as it can provide the foregoing physical properties and specific examples thereof are inorganic alkaline agents such as sodium tertiary phosphate, potassium tertiary phosphate, ammonium tertiary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide and lithium hydroxide.

In addition, an organic alkaline agent may additionally be used in combination for the delicate adjustment of the alkali concentration and for assisting the dissolution of the light-sensitive layer in the developer. Examples of such organic alkaline agents are monomethylamine, dimethylamine, trimethylamine, monoethylamine, diethyl-amine, triethylamine, monoisopropylamine, diisopropylamine, triisopropylamine, n-butylamine, monoethanolamine, diethanolamine, triethanolamine, monoisopropanol-amine, diisopropanolamine, ethyleneimine, ethylenediamine, pyridine and tetramethyl ammonium hydroxide.

These alkaline agents may be used alone or in any combination of at least two of them.

The pH value of the developer used in the present invention ranges from 10.0 to 12.5. If the pH value is less than the lower limit, any image cannot be formed, while if it exceeds the upper limit, problems arise such that the development excessively proceeds, that the exposed portions are strongly damaged during the development and that the printing durability of the resulting printing plate is impaired. In this respect, the pH value of the developer preferably ranges from 10.5 to 12.4. The pH value of the developer more preferably ranges from 11.0 to 12.3.

In addition, the electrical conductivity of the developer used in the present invention ranges from 3 to 30 mS/cm. This is because if it is less than the lower limit, it in general becomes difficult to dissolve the light-sensitive composition in the developer out of the surface of the aluminum substrate and the resulting printing plate correspondingly causes scumming, while if it exceeds the upper limit, the dissolution speed of the light-sensitive layer in the developer is extremely reduced because of the high salt concentration and there is a tendency of leaving undissolved residue on the unexposed areas. The electrical conductivity of the developer preferably ranges from 4 to 25 mS/cm and more preferably 5 to 20 mS/cm.

It is essential for the developer used in the invention to include a nonionic surfactant carrying a polyoxyalkylene ether group and the addition of this surfactant to the developer can accelerate the dissolution of the unexposed portion on the light-sensitive layer and can reduce the penetration of the developer into the exposed area of the light-sensitive layer.

The surfactant carrying a polyoxyalkylene ether group suitably used herein is one having a structure represented by the following general formula (I):

$$R^1-O-(R^2-O)_nH \qquad (I)$$

wherein $R^1$ represents an alkyl group having 3 to 15 carbon atoms, which may have a substituent, an aromatic hydrocarbon group having 6 to 15 carbon atoms, which may be substituted with a substituent, or a aromatic heterocyclic group having 4 to 15 carbon atoms, which may have a substituent (in this respect, examples of substituents usable herein are alkyl groups each having 1 to 20 carbon atoms, halogen atoms such as Br, Cl and I, aromatic hydrocarbon groups each having 6 to 15 carbon atoms, aralkyl groups each having 7 to 17 carbon atoms, alkoxy groups each having 1 to 20 carbon atoms, alkoxycarbonyl groups each having 2 to 20 carbon atoms and acyl groups each having 2 to 15 carbon atoms), $R^2$ represents an alkylene group having 1 to 100 carbon atoms, which may have a substituent (wherein examples of substituents are alkyl groups each having 1 to 20 carbon atoms and aromatic hydrocarbon groups each having 6 to 15 carbon atoms) and n represents an integer ranging from 1 to 100.

Moreover, the moiety: $(R^2-O)_n$ of the compound of the formula (I) may comprise two or three different groups falling within the range specified above. Examples thereof are combinations such as ethyleneoxy and propyleneoxy groups; ethyleneoxy and isopropyloxy groups; ethyleneoxy and butyleneoxy groups; and ethyleneoxy and isobutyleneoxy groups, which are connected to one another in a random or block-like configuration.

In the present invention, the surfactants each carrying a polyoxyalkylene ether group may be used alone or in a composite system and it is effective to add the same to the developer in an amount ranging from 1 to 30% by weight and preferably 2 to 20% by weight.

If the added amount of the surfactant is too small, the developing ability of the resulting developer is reduced, while if it is too large, the printing plate is greatly damaged by the development and the printing durability of the resulting printing plate is reduced.

Moreover, other surfactants such as those listed below may be added to the developer used in the present invention.

Examples thereof are nonionic surfactants, for instance, polyoxyethylene alkyl ethers such as polyoxyethylene lauryl ether, polyoxyethylene cetyl ether and polyoxyethylene stearyl ether, polyoxyethylene alkylallyl ethers such as polyoxyethylene octylphenyl ether and polyoxyethylene nonylphenyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesqui-oleate and sorbitan trioleate, and monoglyceride alkyl esters such as glycerol monostearate and glycerol monooleate; anionic surfactants, for instance, alkylbenzene sulfonic acid salts such as sodium dodecylbenzene sulfonate, alkylnaphthalene sulfonic acid salts such as sodium butylnaphthalene sulfonate, sodium pentylnaphthalene sulfonate, sodium hexylnaphthalene sulfonate and sodium octylnaphthalene sulfonate, alkylsulfuric acid salts such as sodium lauryl sulfate, alkyl-sulfonic acid salts such as sodium dodecyl sulfonate, and sulfosuccinic acid ester salts such as sodium dilauryl sulfosuccinate; and amphoteric surfactants, for instance, alkyl betaines such as lauryl betaines and stearyl betaines, and amino acids, with anionic surfactants such as alkylnaphthalene sulfonic acid salts being particularly preferred.

These surfactants may be used alone or in any combination. In addition, the content of these surfactants in the developer preferably ranges from 0.1 to 20% by weight as expressed in terms of the amount of the effective component.

In addition to the foregoing components, the developer used in the present invention may if necessary comprise various components listed below in combination. Examples thereof include organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-2-hydroxyethylbenzoic acid, decanoic acid, salicylic acid and 3-hydroxy-2-naphthoic acid; organic solvents such as isopropyl alcohol, benzyl alcohol, ethyl cellosolve, butyl cellosolve, phenyl cellosolve, phenyl cellosolve, propylene glycol and diacetone alcohol; and other components such as chelating agents, reducing agents, dyes, pigments, water softeners, preservatives and antifoamers.

Then the presensitized plate for use in making a lithographic printing plate used in the present invention will hereunder be described in detail.

The photopolymerizable light-sensitive composition constituting the light-sensitive layer of the presensitized plate used in the present invention comprises, as essential components, an addition polymerizable ethylenically unsaturated compound, a photopolymerization initiator and a polyurethane resin binder and further comprises, if necessary, a variety of compounds such as coloring agents, plasticizers and thermal polymerization inhibitors in combination with the foregoing essential components.

The ethylenically unsaturated compound herein used means a compound having an ethylenically unsaturated double bond, which can undergo addition polymerization, crosslinking and curing by the action of a photopolymerization initiator, when the photopolymerizable light-sensitive composition is irradiated with actinic light rays.

The compound carrying an addition-polymerizable ethylenically unsaturated double bond can arbitrarily be selected from the group consisting of those having at least one and preferably at least two terminal ethylenically unsaturated bonds.

Examples thereof are those each having a chemical structure such as a monomer, a prepolymer, i.e., a dimer, a trimer and an oligomer, or a mixture thereof as well as a copolymer thereof.

Examples of such monomers and copolymers thereof are esters of unsaturated carboxylic acids (such as acrylic acid, methacrylic acid, itaconic acid, crotonic acid, isocrotonic acid and maleic acid) with aliphatic polyhydric alcohol compounds, and amides of unsaturated carboxylic acids with aliphatic polyvalent amines.

Specific examples of monomeric esters of unsaturated carboxylic acids with aliphatic polyhydric alcohol compounds are acrylates such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer.

Examples of methacrylates are tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylethane and bis[p-(methacryloxy ethoxy)phenyl]dimethylmethane.

Examples of itaconates are ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of crotonates are ethylene glycol dicrotonate, tetramethylene glycol dicrotonate, pentaerythritol dicrotonate and sorbitol tetracrotonate.

Examples of isocrotonates are ethylene glycol diisocrotonate, pentaerythritol diisocrotonate and sorbitol tetraisocrotonate.

Examples of maleates are ethylene glycol dimaleate, triethylene glycol dimaleate, pentaerythritol dimaleate and sorbitol tetramaleate.

Moreover, examples of the foregoing ester monomers likewise include mixtures of the foregoing ester monomers.

Specific examples of amide monomers of aliphatic polyvalent amine compounds with unsaturated carboxylic acids are methylenebis-acrylamide, methylenebis-methacrylamide, 1,6-hexamethylenebis-acrylamide, 1,6-hexamethylenebis-methacryl-amide, diethylenetriamine trisacrylamide, xylylene bisacrylamide and xylylene bis-methacrylamide.

Other examples of the foregoing monomers or copolymers include vinyl urethane compounds having not less than 2 polymerizable vinyl groups in the molecule, which are prepared by adding vinyl monomers having a hydroxyl group and represented by the following general formula (A) to polyisocyanate compounds having at least two isocyanate groups in the molecule such as those disclosed in Japanese Examined Patent Publication (hereunder referred to as "J.P. KOKOKU") No. Sho 48-41708:

CH$_2$=C(R$^5$)COOCH$_2$CH(R$^6$)OH     (A)

wherein R$^5$ and R$^6$ each represents H or a methyl group.

Examples of the ethylenically unsaturated compounds further include urethane acrylates such as those disclosed in J.P. KOKAI No. Sho 51-37193 and J.P. KOKOKU No. Hei 2-32293; and polyfunctional acrylates and methacrylates such as polyester acrylates and epoxy (meth) acrylates obtained by reacting epoxy resins with (meth) acrylic acid, as disclosed in J.P. KOKAI No. Sho 48-64183 and J.P. KOKOKU Nos. Sho 49-43191 and Sho 52-30490. Moreover, it is also possible to use those introduced in Bulletin of Adhesive Association in Japan, 1984, Vol. 20, No. 7, pp. 300–308 as photo-curable monomers and oligomers.

In this connection, the amount of these ethylenically unsaturated compounds to be used ranges from 5 to 80% by weight and preferably 30 to 70% by weight on the basis of the total amount of the components constituting the light-sensitive layer.

In the present invention, the photopolymerization initiators to be incorporated into the light-sensitive layer of the presensitized plate may be a variety of photopolymerization initiators known in the conventional patents and literature or any combined system (photo-initiator systems) of at least two photopolymerization initiators, which may appropriately be selected depending on the wavelength of a light source used. Specific examples thereof will be listed below, but the present invention is not restricted to these specific examples at all.

A variety of photopolymerization initiators have been proposed even when using visible light rays having a wavelength of not less than 400 nm, an Ar laser, second harmonic waves of a semiconductor laser, an FD-YAG laser or an He—Ne laser as a light source. For instance, there may be listed some kinds of photo-reductive dyes disclosed in U.S. Pat. No. 2,850,445 such as Rose Bengale, Eosine and Erythrocin; systems comprising combinations of dyes with initiators such as composite initiator systems comprising dyes and amines (J.P. KOKOKU No. Sho 44-20189), combined systems comprising hexaaryl biimidazole, radical generators and dyes (J.P. KOKOKU No. Sho 45-37377), systems comprising hexaaryl biimidazole and p-dialkylamino-benzylidene ketones (J.P. KOKOKU No. Sho 47-2528 and J.P. KOKAI No. Sho 54-155292), systems comprising cyclic cis-α-dicarbonyl compounds and dyes (J.P. KOKAI No. Sho 48-84183), systems comprising cyclic triazine and merocyanine dyes (J.P. KOKAI No. Sho 54-151024), systems comprising 3-ketocumarin and activators (J.P. KOKAI Nos. Sho 52-112681 and Sho 58-15503), systems comprising biimidazole, styrene derivatives and thiols (J.P. KOKAI No. Sho 59-140203), systems comprising organic peroxides and dyes (J.P. KOKAI Nos. Sho 59-1504, Sho 59-140203, Sho 59-189340 and Sho 62-174203, J.P. KOKOKU No. Sho 62-1641 and U.S. Pat. No. 4,766,055), systems comprising dyes and active halogen-containing compounds (for instance, J.P. KOKAI Nos. Sho 63-258903 and Hei 2-63054), systems comprising dyes and borate compounds (for instance, J.P. KOKAI Nos. Sho 62-143044, Sho 62-150242, Sho 64-13140, Sho 64-13141, Sho 64-13142, Sho 64-13143, Sho 64-13144, Sho 64-17048, Hei 1-229003, Hei 1-298348 and Hei 1-138204), systems comprising dyes having rhodanine rings and radical generators (J.P. KOKAI Nos. Hei 2-179643 and Hei 2-244050), systems comprising titanocene and 3-ketocumarin dyes (J.P. KOKAI No. Sho 63-221110), systems comprising combinations of titanocene, xanthene dyes and further addition-polymerizable ethylenically unsaturated compounds each carrying an amino or urethane group (J.P. KOKAI Nos. Hei 4-221958 and Hei 4-219756), systems comprising titanocene and specific merocyanine dyes (J.P. KOKAI No. Hei 6-295061) and systems comprising titanocene and benzopyran ring-containing dyes (J.P. KOKAI No. Hei 8-334897).

In addition, there has recently been developed a laser (violet laser) having a wavelength ranging from 360 to 430 nm and there have correspondingly been developed photopolymerization initiator systems, which are responsive to the laser beam and show a high sensitivity to light rays having wavelengths of not more than 450 nm. Therefore, these photo-initiator systems can be used in the present invention. Examples of such initiator systems are cationic dye/borate systems (J.P. KOKAI No. Hei 11-84647), merocyanine dye/titanocene systems (J.P. KOKAI No. 2000-147763) and carbazole type dye/titanocene systems (J.P. KOKAI No. 2001-42524).

The systems comprising titanocene compounds are particularly preferred in the present invention because of their high sensitivity.

A variety of such titanocene compounds may be herein used, but the titanocene compound may appropriately be selected from those disclosed in, for instance, J.P. KOKAI Nos. Sho 59-152396 and Sho 61-151197. Specific examples thereof are di-cyclopentadienyl-Ti-di-chloride, di-cyclopentadienyl-Ti-bis-phenyl, di-cyclopenta-dienyl-Ti-bis-2,3,4,5,6-pentafluorophen-1-yl, di-cyclopentadienyl-Ti-bis-2,3,5,6-tetra-fluorophen-1-yl, di-cyclopentadienyl-Ti-bis-2,4,6-trifluorophen-1-yl, di-cyclopentadienyl-Ti-bis-2,6-di-fluorophen-1-yl, di-cyclopentadienyl-Ti-bis-2,4-di-fluorophen-1-yl, di-methylcyclopentadienyl-Ti-bis-2,3,4,5,6-pentafluorophen-1-yl, di-methylcyclopenta-dienyl-Ti-bis-2,6-di-fluorophen-1-yl and di-cyclopentadienyl-Ti-bis-2,6-di-fluoro-3-(pyrro-1-yl)-phen-1-yl.

Moreover, it has been known that the photopolymerization-initiating ability of the foregoing photopolymerization initiator is further improved by, at need, the addition of a hydrogen-donating compound, for instance, a thiol compound such as 2-mercaptobenzothiazole, 2-mercaptobenzimidazole or 2-mercaptobenzoxazole; or an amine compound such as N-phenylglycine or N,N-dialkylamino-aromatic alkyl ester.

The total amount of these photo-initiator systems (laser light-absorbing dyes, photopolymerization initiators, auxiliary agents for sensitization) ranges from 0.05 to 100 parts by weight, preferably 0.1 to 70 parts by weight and more preferably 0.2 to 50 parts by weight per 100 parts by weight of the ethylenically unsaturated compound.

The polyurethane resin binder used in the light-sensitive layer of the presensitized plate used in the present invention should not only serve as a film-forming agent for the composition, but also be soluble in an alkaline developer. Accordingly, the binders usable herein are polyurethane high molecular weight polymers, which are soluble in or get swollen with an aqueous alkaline solution.

Examples of the polyurethane resin binders useful in the present invention also include those disclosed in J.P. KOKOKU Nos. Hei 7-120040, Hei 7-120041, Hei 7-120042 and Hei 8-12424, J.P. KOKAI Nos. Sho 63-287944, Sho 63-287947, Hei 1-271741, Hei 11-352691, 2001-109139, 2001-117229, 2001-125265, 2001-125257, 2001-228614 and 2001-228608.

The polyurethane resin binder will be detailed below.

The polyurethane resin as an essential component for the light-sensitive layer of the presensitized plate to which the plate-making method of the present invention is applied is one having, as a basic skeleton, a structural unit represented by a reaction product of at least one diisocyanate compound represented by the following general formula (1)' with at least one diol compound represented by the following general formula (1)":

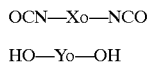 (1)'

HO—Yo—OH (1)"

(wherein Xo and Yo each represents a divalent organic group).

Among these polyurethane resins, preferred are those having carboxyl groups in an amount of not less than 0.4 meq/g. Polyurethane resins suitably used in the present invention are those each having, as a basic skeleton, a structural unit represented by a reaction product of a diisocyanate compound represented by the following general formula (1) with at least one diol compound represented by the following general formula (2), (3) and (4) and/or a structural unit derived from a compound obtained by the ring opening of a tetracarboxylic acid dianhydride with a diol compound.

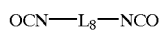 (1)

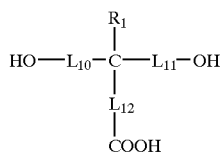 (2)

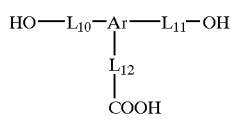 (3)

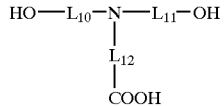 (4)

In the formulas, $L_8$ represents a divalent aliphatic or aromatic hydrocarbon group, which may have a substituent. The group $L_8$ may comprise other functional groups such as ester, urethane, amide and/or ureide groups, which do not react with isocyanate groups.

The substituent $R_1$ represents a hydrogen atom or an alkyl, aralkyl, aryl, alkoxy or aryloxy group, which may be substituted with a substituent (for instance, cyano, nitro, halogen atoms (such as —F, —Cl, —Br, —I), —CONH$_2$, —COOR$_{113}$, —OR$_{113}$, —NHCONH—R$_{113}$, —NHCOOR$_{113}$, —NHCOR$_{113}$ and —OCONHR$_{113}$ (wherein R$_{113}$ represents an alkyl group having 1 to 10 carbon atoms or an aralkyl group having 7 to 15 carbon atoms)) and preferably represents a hydrogen atom, an alkyl group having 1 to 8 carbon atoms or an aryl group having 6 to 15 carbon atoms. $L_{10}$, $L_{11}$ and $L_{12}$ may be the same or different and each represents a single bond or a divalent aliphatic or aromatic hydrocarbon group, which may have a substituent (preferably, for instance, alkyl, aralkyl, aryl, alkoxy groups and/or halogen atoms) and preferably represents an alkylene group having 1 to 20 carbon atoms or an arylene group having 6 to 15 carbon atoms and more preferably an alkylene group having 1 to 8 carbon atoms. If necessary, $L_{10}$, $L_{11}$ and $L_{12}$ may comprise other functional groups such as carbonyl, ester, urethane, amide, ureide and/or ether groups, which do not react with isocyanate groups. In this connection, two or three of $R_1$, $L_{10}$, $L_{11}$ and $L_{12}$ may form a ring together.

Ar represents a trivalent aromatic hydrocarbon group, which may have a substituent, and preferably an aromatic group having 6 to 15 carbon atoms.

i) Diisocyanate Compounds

Specific examples of the diisocyanate compounds represented by Formula (1) include aromatic diisocyanate compounds such as 2,4-tolylene diisocyanate, dimmer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; aliphatic diisocyanate compounds such as hexamethylene diisocyanate, trimethyl hexamethylene diisocyanate, lysine diisocyanate and dimeric acid diisocyanate; alicyclic diisocyanate compounds such as isophorone diisocyanate, 4,4'-methylenebis(cyclohexyl isocyanate), methylcyclohexane-2,4 (or 2,6)diisocyanate and 1,3-(isocyanate methyl) cyclohexane; and diisocyanate compounds as reaction products of diols and diisocyanates such as addition product of one mole of 1,3-butylene glycol with 2 moles of tolylene diisocyanate.

ii) Diol Compounds having Carboxyl Group

Moreover, specific examples of the diol compounds each having carboxyl group and represented by the foregoing formula (2), (3) or (4) are 3,5-dihydroxy benzoic acid, 2,2-bis(hydroxymethyl)propionic acid, 2,2-bis(2-hydroxyethyl)propionic acid, 2,2-bis(3-hydroxypropyl) propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethyl glycine and N,N-bis(2-hydroxyethyl)-3-carboxy-propionamide.

In the present invention, preferred tetracarboxylic acid dianhydride used in the synthesis of the polyurethane resin may be, for instance, those represented by the following general formulas (5), (6) and (7):

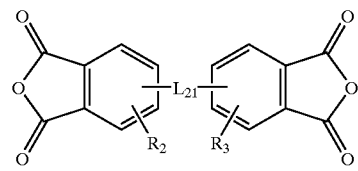 (5)

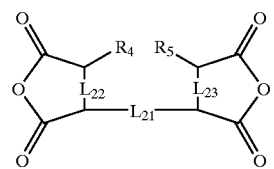 (6)

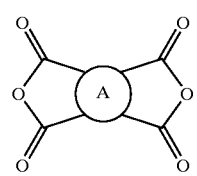 (7)

wherein $L_{21}$ represents a single bond, a divalent aliphatic or aromatic hydrocarbon group, which may have a substituent (preferably selected from, for instance, alkyl, aralkyl, aryl, alkoxy, halogeno, ester and amide groups), —CO—, —SO—, —SO$_2$—, —O— or —S—, with a single bond, a divalent aliphatic hydrocarbon group having 1 to 15 carbon atoms, —CO—, —SO$_2$—, —O— or —S— being preferred. $R_2$ and $R_3$ may be the same or different and each represents a hydrogen atom, an alkyl group, an aralkyl group, an aryl group, an alkoxy group or a halogen atom, with a hydrogen atom, an alkyl group having 1 to 8 carbon atoms, an aryl group having 6 to 15 carbon atoms, an alkoxy group having 1 to 8 carbon atoms or a halogen atom being preferred. Moreover, two of $L_{21}$, $R_2$ and $R_3$ may be bonded together to form a ring. $R_4$ and $R_5$ may be the same or different and each represents a hydrogen atom, an alkyl group, an aralkyl group, an aryl group or a halogen atom, with a hydrogen atom, an alkyl group having 1 to 8 carbon atoms or an aryl group having 6 to 15 carbon atoms being preferred. Moreover, two of $L_{21}$, $R_4$ and $R_5$ may be bonded together to form a ring. $L_{22}$ and $L_{23}$ may be the same or different and each represents a single bond, a double bond, or a divalent aliphatic hydrocarbon group, with a single bond, a double bond or a methylene group being preferred. A represents a mono- or poly-nuclear aromatic ring, with an aromatic ring having 6 to 18 carbon atoms being preferred.

Specific examples of the compounds represented by the formulas (5), (6) and (7) include aromatic tetracarboxylic acid dianhydrides such as pyromellitic dianhydride, 3,3', 4,4'-benzophenone tetracarboxylic dianhydride, 3,3', 4,4'-diphenyl tetracarboxylic dianhydride, 2,3,6,7-naphthalene tetracarboxylic dianhydride, 1,4,5,8-naphthalene tetracarboxylic dianhydride, 4,4'-sulfonyl diphthalic dianhydride, 2,2-bis(3,4-dicarboxy-phenyl)propane dianhydride, bis(3,4-dicarboxy-phenyl)ether dianhydride, 4,4'-[3,3'-(alkylphosphoryl-diphenylene)-bis(iminocarbonyl)] diphthalic dianhydride, adduct product of hydroquinone diacetate and trimellitic anhydride and adduct of diacetyl diamine and trimellitic anhydride; alicyclic tetracarboxylic dianhydrides such as 5-(2,5-dioxotetrahydrofuryl)-3-methyl-3-cyclohexene-1,2-dicarboxylic anhydride (EPICHRON B-4400, available from Dainippon Ink and Chemicals, Inc.), 1,2,3,4-cyclopentane tetracarboxylic dianhydride, 1,2,4,5-cyclohexane tetracarboxylic dianhydride and tetrahydrofuran tetracarboxylic dianhydride; and aliphatic tetracarboxylic dianhydrides such as 1,2,3,4-butane tetracarboxylic dianhydride and 1,2,4,5-pentane tetracarboxylic dianhydride.

Examples of methods for introducing, into the polyurethane resins, the structural units derived from compounds obtained by ring opening of these tetracarboxylic dianhydrides with diol compounds are those listed below:

a) A method comprising the step of reacting a compound having an alcohol terminal and obtained by ring opening of a tetracarboxylic dianhydride by the use of a diol compound, with a diisocyanate compound; and b) A method comprising the step of reacting a urethane compound, which has an alcohol terminal and is obtained by reacting a diisocyanate compound with a diol compound under such a condition that the latter is present in excess, with a tetracarboxylic dianhydride.

In this respect, specific examples of the diol compounds used in the foregoing reactions are ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxy cyclohexane, cyclohexane dimethanol, tricyclodecane dimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone dihydroxyethyl ether, p-xylylene glycol, dihydroxyethyl sulfone, bis(2-hydroxyethyl)-2,4-tolylene dicarbamate, 2,4-tolylene-bis(2-hydroxyethylcarbamide), bis(2-hydroxyethyl)-m-xylylene dicarbamate and bis(2-hydroxyethyl)isophthalate.

iii) Other Diol Compounds

The polyurethane resin used in the present invention is more preferably one further comprising a structural unit represented by the reaction product with at least one member selected from the group consisting of polyether diol compounds, polyester diol compounds and polycarbonate diol compounds.

Examples of the polyether diol compounds are those represented by the following general formulas (A), (B), (C), (D) and (E) and random copolymers of ethylene oxide with propylene oxide having a terminal hydroxyl group:

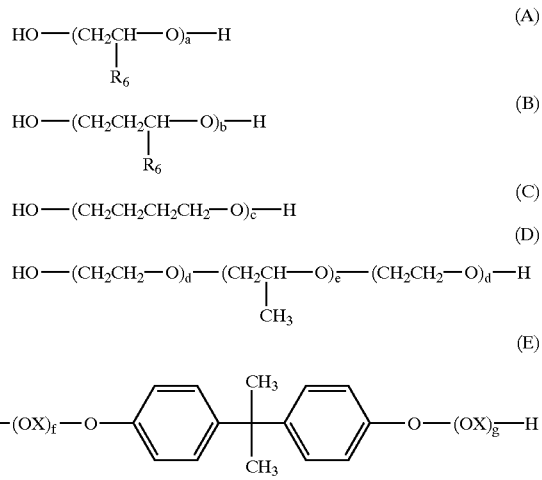

In the formulas, $R_6$ represents a hydrogen atom or a methyl group and X represents a group —$CH_2CH_2$— or —$CH_2CH(CH_3)$—.

The suffixes a, b, c, d, e, f and g each represents an integer of not less than 2 and preferably an integer ranging from 2 to 100.

Specific examples of the polyether diol compounds represented by Formulas (A) and (B) are diethylene glycol, triethylene glycol, tetraethylene glycol, pentaethylene glycol, hexamethylene glycol, heptamethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having an average molecular weight of 1000, polyethylene glycol having an average molecular weight of 1500, polyethylene glycol having an average molecular weight of 2000, polyethylene glycol having an average molecular weight of 3000, polyethylene glycol having an average molecular weight of 7500, polypropylene glycol having an average molecular weight of 400, polypropylene glycol having an average molecular weight of 700, polypropylene glycol having an average molecular weight of 1000, polypropylene glycol having an average molecular weight of 2000, polypropylene glycol having an average molecular weight of 3000 and polypropylene glycol having an average molecular weight of 4000.

Specific examples of the polyether diol compounds represented by the formula (C) include PTMG650, PTMG1000, PTMG20000 and PTMG3000 available from Sanyo Chemical Industries, Ltd.

Specific examples of the polyether diol compounds represented by the formula (D) include NEW POLE PE-61, NEW POLE PE-62, NEW POLE PE-64, NEW POLE PE-68, NEW POLE PE-71, NEW POLE PE-74, NEW POLE PE-75, NEW POLE PE-78, NEW POLE PE-108 and NEW POLE PE-128 available from Sanyo Chemical Industries, Ltd.

Specific examples of the polyether diol compounds represented by the formula (E) include NEW POLE BPE-20, NEW POLE BPE-20F, NEW POLE BPE-20NK, NEW POLE BPE-20T, NEW POLE BPE-20G, NEW POLE BPE-40, NEW POLE BPE-60, NEW POLE BPE-100, NEW POLE BPE-180, NEW POLE BPE-2P, NEW POLE BPE-23P, NEW POLE BPE-3P and NEW POLE BPE-5P available from Sanyo Chemical Industries, Ltd.

Specific examples of the random copolymers of ethylene oxide with propylene oxide having a hydroxyl group at the terminal are NEW POLE 50HB-100, NEW POLE 50HB-260, NEW POLE 50HB-400, NEW POLE 50HB-660, NEW POLE 50HB-2000 and NEW POLE 50HB-5100 available from Sanyo Chemical Industries, Ltd.

Examples of the polyester diol compounds include those represented by the following general formulas (8) and (9):

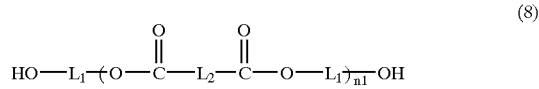

(8)

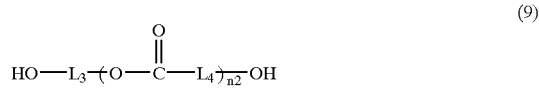

(9)

wherein $L_1$, $L_2$ and $L_3$ may be the same or different and each represents a divalent aliphatic or aromatic hydrocarbon group and $L_4$ represents a divalent aliphatic group, with an alkylene, alkenylene, alkynylene or arylene group being preferred for $L_1$, $L_2$ and $L_3$ and an alkylene group being preferred for $L_4$. In addition, the substituents $L_1$, $L_2$, $L_3$ and $L_4$ may comprise another functional group, which never reacts with the isocyanate group, such as an ether, carbonyl, ester, cyano, olefin, urethane, amide or ureide group or a halogen atom. The suffixes n1 and n2 each represents an integer of not less than 2 and preferably an integer ranging from 2 to 100.

Examples of the polycarbonate diol compounds include those represented by the following general formula (10):

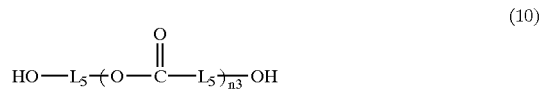

(10)

wherein the groups $L_5$ may be the same or different and each represents a divalent aliphatic or aromatic hydrocarbon group, with an alkylene, alkenylene, alkynylene or arylene group being preferred. The group $L_5$ may further comprise another functional group, which never reacts with the isocyanate group, such as an ether, carbonyl, ester, cyano, olefin, urethane, amide or ureide group or a halogen atom. The suffix n3 represents an integer of not less than 2 and preferably an integer ranging from 2 to 100.

Specific examples of the diol compounds represented by the formulas (8), (9) and (10) are those listed below. In the following specific examples, n is an integer of not less than 2.

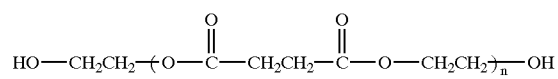

(No. 1)

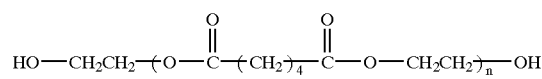

(No. 2)

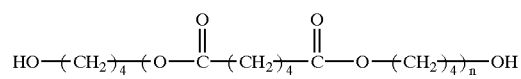

(No. 3)

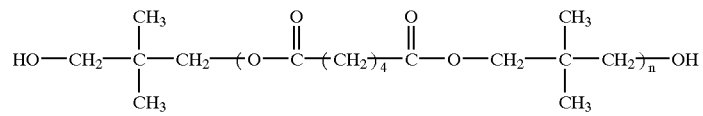

(No. 4)

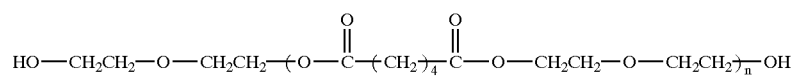

(No. 5)

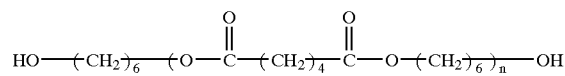

(No. 6)

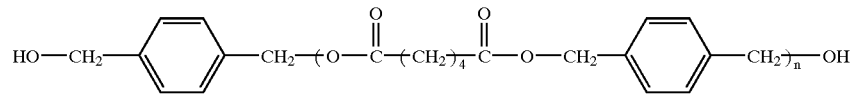

(No. 7)

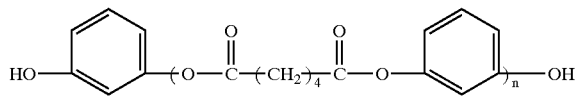
(No. 8)

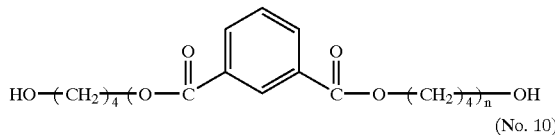
(No. 9)

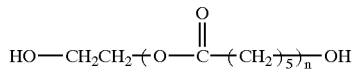
(No. 10)

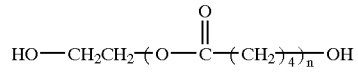
(No. 11)

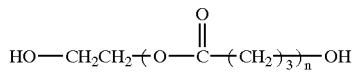
(No. 12)

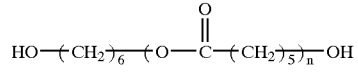
(No. 13)

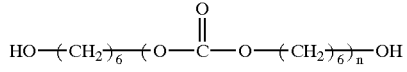
(No. 14)

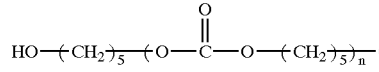
(No. 15)

(No. 16)

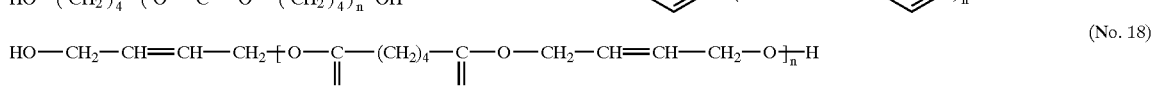
(No. 17)

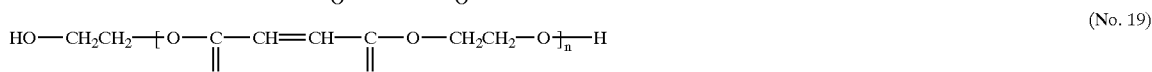
(No. 18)

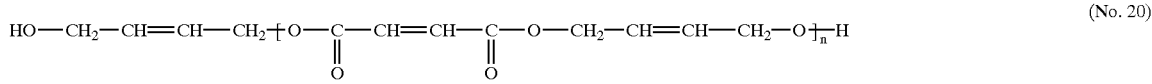
(No. 19)

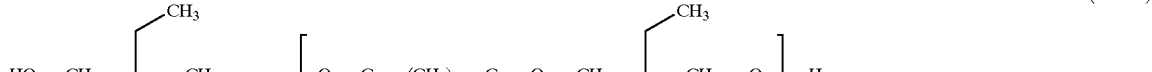
(No. 20)

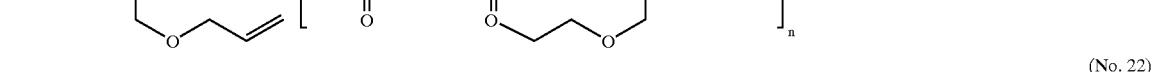
(No. 21)

(No. 22)

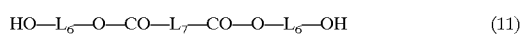
m = 2, 4
(No. 23)

Moreover, it is also possible to use diol compounds, which are free of any carboxyl group and may have another substituent free of any reactivity with the isocyanate group, in combination.

Examples of such diol compounds are those listed below:

$$HO-L_6-O-CO-L_7-CO-O-L_6-OH \quad (11)$$

$$HO-L_7-CO-O-L_6-OH \quad (12)$$

wherein $L_6$ and $L_7$ may be the same or different and each represents a divalent aliphatic or aromatic hydrocarbon group or a heterocyclic group, which may have a substituent (such as an alkyl, aralkyl, aryl, alkoxy or aryloxy group or a halogen atom (—F, —Cl, —Br, —I)). The groups $L_6$ and $L_7$ may, if necessary, comprise another functional group, which never reacts with the isocyanate group, such as a carbonyl, ester, urethane, amide or ureide group. In this connection, the groups $L_6$ and $L_7$ may form a ring together.

Specific examples of the compounds represented by the formulas (11) and (12) are those listed below:

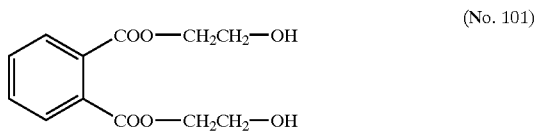
(No. 101)

(No. 102)

*m*-C₆H₄(COO—CH₂CH₂—OH)₂

(No. 103)

*p*-(CH₂COO—CH₂CH₂—OH)(COO—CH₂CH₂—OH)C₆H₄

(No. 104)

HO—CH₂CH₂—O—CO—(2,5-furan)—COO—CH₂CH₂—OH (No. 105)

HO—CH₂CH₂—O—CO—CH=CH—COO—CH₂CH₂—OH (No. 106)

HO—CH₂CH₂—O—COC₁₁H₂₂COO—CH₂CH₂—OH (No. 107)

HO—CH₂CH₂—O—COC₁₂H₂₄COO—CH₂CH₂—OH (No. 108)

HO—CH₂CH₂—O—COC₁₄H₂₈COO—CH₂CH₂—OH (No. 109)

HO—CH₂CH₂—O—CO—C(CH₃)₂—COO—CH₂CH₂—OH (No. 110)

HO—CH₂CH₂—O—CO—C≡C—COO—CH₂CH₂—OH (No. 111)

HO—CH₂CH₂—O—CO—CH₂—C(CH₃)₂—COO—CH₂CH₂—OH (No. 112)

1,2-cyclohexane(COO—CH₂CH₂—OH)₂

(No. 113)

HO—CH₂CH₂—O—CO—CH₂—O—CH₂—COO—CH₂CH₂—OH (No. 114)

HO—CH₂CH₂—O—CO—CH₂—C(=CH₂)—COO—CH₂CH₂—OH (No. 115)

HO—CH₂CH₂—O—CO—CH₂—N(CH₃)—CH₂—COO—CH₂CH₂—OH (No. 116)

HO—CH₂CH₂—O—CO—CH₂CH₂—C(=O)—COO—CH₂CH₂—OH (No. 117)

HO—CH₂CH₂—O—CO—(2,6-pyridine)—COO—CH₂CH₂—OH (No. 118)

2,3-pyrazine(COO—CH₂CH₂—OH)₂

(No. 119)

*m*-C₆H₄(COO—(CH₂)₄—OH)₂

(No. 120)

4-HO—C₆H₄—COO—CH₂CH₂—OH (No. 121)

1-hydroxy-2-naphthyl—COO—CH₂CH₂—OH (No. 122)

4-HO—C₆H₄—CH=CH—COO—CH₂CH₂—OH (No. 123)

HO—CH₂CH₂—COO—CH₂CH₂—OH (No. 124)

HO—CH₂—C(CH₃)₂—COO—CH₂CH₂—OH (No. 125)

4-HO—C₆H₄—CH₂COO—CH₂CH₂—OH (No. 126)

CH₃—CH(OH)—CH₂—COO—CH₂CH₂—OH (No. 127)

2-HO—C₆H₄—COO—(2-C₆H₄)—COO—CH₂CH₂—OH (No. 128)

2,5-dimethoxy-1,4-C₆H₂[(CH₂)₃COO—CH₂CH₂—OH][CO—(CH₂)₃—O—CH₂CH₂—OH]

The following diol compounds may likewise be suitably used in the present invention.

HO(CH₂)ₑOH (15)

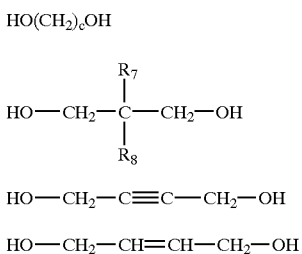
(16)

HO—CH₂—C≡C—CH₂—OH (17)

HO—CH₂—CH=CH—CH₂—OH (18)

wherein $R_7$ and $R_8$ may be the same or different and each represents an alkyl group, which may have a substituent, c is the same as that defined above and represents an integer of not less than 2 and preferably an integer ranging from 2 to 100.

Specific examples of the diol compounds represented by the formulas (15), (16), (17) and (18) include those listed below:

Examples of the compounds of Formula (15) are ethylene glycol, 1,3-propanediol, 1,4-butanediol, 1,5-pentanediol, 1,6-hexanediol, 1,7-heptanediol and 1,8-octanediol. Examples of the diol compounds of Formula (16) are those listed below:

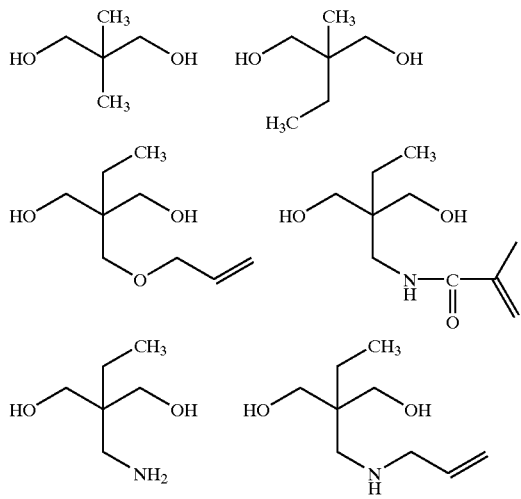

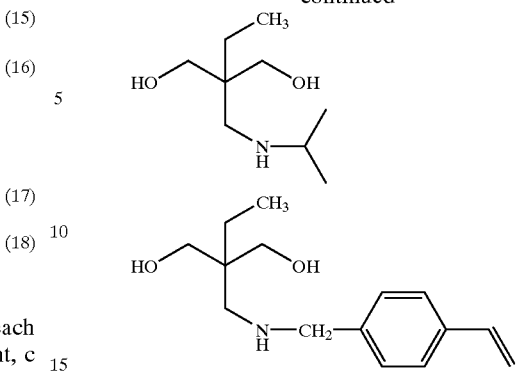

Examples of the compounds of the formula (17) include 2-butene-1,4-diol and examples of those represented by the formula (18) are cis-2-butene-1,4-diol and trans-2-butene-1,4-diol.

The diol compounds listed below can likewise be suitably used in the invention:

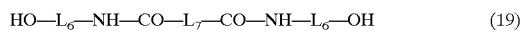
(19)

(20)

wherein $L_6$ and $L_7$ may be the same or different and each represents a divalent aliphatic or aromatic hydrocarbon group or a heterocyclic group, which may have a substituent (such as an alkyl, aralkyl, aryl, alkoxy or aryloxy group or a halogen atom (—F, —Cl, —Br, —I)). The groups $L_6$ and $L_7$ may, if necessary, comprise another functional group, which never reacts with the isocyanate group, such as a carbonyl, ester, urethane, amide or ureide group. In this connection, the groups $L_6$ and $L_7$ may form a ring together.

Specific examples of the compounds represented by the formulas (19) and (20) are those listed below:

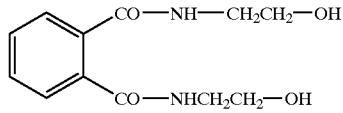
(No. 201)

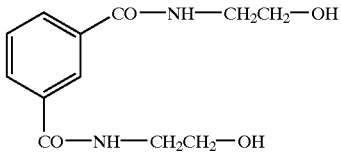
(No. 202)

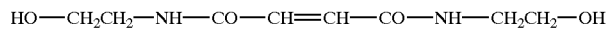
(No. 203)

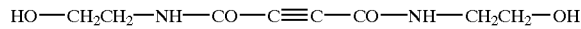
(No. 204)

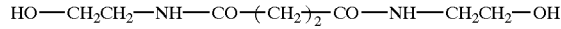
(No. 205)

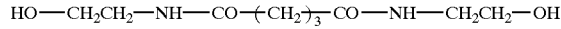
(No. 206)

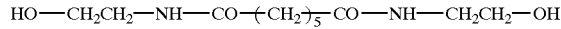
(No. 207)

-continued

(No. 208)

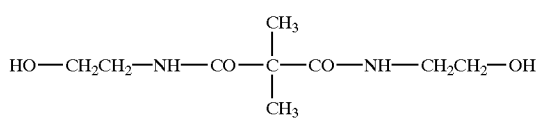
(No. 209)

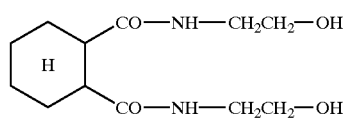
(No. 210)

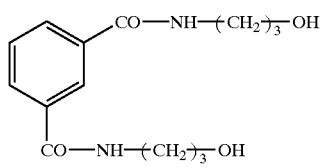
(No. 211)

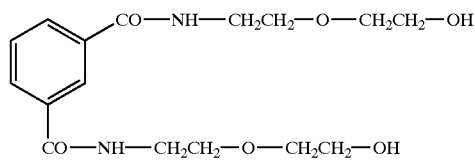
(No. 212)

(No. 213)

(No. 214)

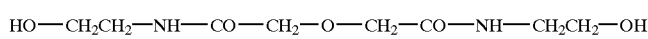
(No. 215)

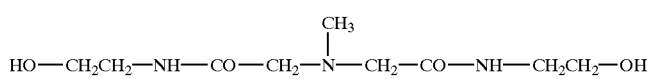
(No. 216)

(No. 217)

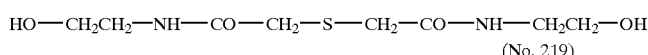
(No. 218)

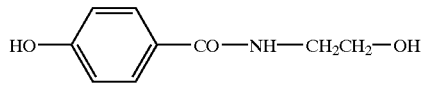
(No. 219)

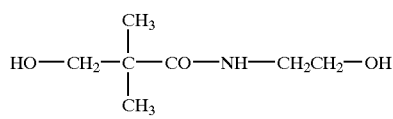
(No. 220)

Examples of diol compounds suitably used herein also include those represented by the following general formulas (21) and (22):

 (21)

 (22)

wherein $L_{16}$ represents a divalent aliphatic hydrocarbon group, which may have a substituent (such as an alkyl, aralkyl, aryl, alkoxy or aryloxy group or a halogen atom). The groups $L_{16}$ may, if necessary, comprise another functional group, which never reacts with the isocyanate group, such as an ester, urethane, amide or ureide group.

The groups $Ar_2$ and $Ar_3$ may be the same or different and each represents a divalent aromatic hydrocarbon group, which may have a substituent, and preferably an aromatic group having 6 to 15 carbon atoms.

The suffix n represents an integer ranging from 0 to 10.

In addition, specific examples of the diol compounds represented by the formulas (21) and (22) are catechol, resorcin, hydroquinone, 4-methyl catechol, 4-t-butyl catechol, 4-acetyl catechol, 3-methoxy catechol, 4-phenyl catechol, 4-methyl resorcin, 4-ethyl resorcin, 4-t-butyl resorcin, 4-hexyl resorcin, 4-chlororesorcin, 4-benzyl resorcin, 4-acetyl resorcin, 4-carbomethoxy resorcin, 2-methyl resorcin, 5-methyl resorcin, t-butyl hydroquinone, 2,5-di-t-butyl hydroquinone, 2,5-di-t-amyl hydroquinone, tetramethyl hydroquinone, tetrachloro-hydroquinone, methylcarboamino-hydroquinone, methyl-ureido-hydroquinone, methylthio-hydroquinone, benzonorbornene-3,6-diol, bisphenol A, bisphenol S, 3,3'-dichlorobisphenol S, 4,4'-dihydroxy benzophenone, 4,4'-dihydroxy biphenyl, 4,4'-thiodiphenol, 2,2'-dihydroxy diphenylmethane, 3,4-bis (p-hydroxyphenyl)hexane, 1,4-bis(2-(p-hydroxyphenyl)propyl) benzene, bis(4-hydroxyphenyl)methyl-amine, 1, 3-dihydroxy naphthalene, 1,4-dihydroxy naphthalene, 1,5-dihydroxy naphthalene, 2,6-dihydroxy naphthalene, 1,5-dihydroxy anthraquinone, 2-hydroxy-benzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxybenzoate, 2-hydroxyethyl-4-hydroxyphenyl acetate and resorcin mono-2-hydroxyethyl ether. The following diol compounds may likewise be suitably used in the present invention:

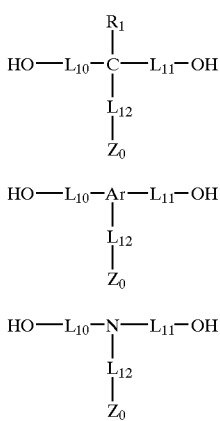

(23)

(24)

(25)

The substituent $R_1$ represents a hydrogen atom or an alkyl, aralkyl, aryl, alkoxy or aryloxy group, which may be substituted with a substituent (for instance, cyano, nitro, halogen atoms (such as —F, —Cl, —Br, —I), —CONH$_2$, —COOR$_{113}$, —OR$_{113}$, —NHCONH—R$_{113}$, —NHCOOR$_{113}$, —NHCOR$_{113}$ and —OCONHR$_{113}$ (wherein $R_{113}$ represents an alkyl group having 1 to 10 carbon atoms or an aralkyl group having 7 to 15 carbon atoms)) and preferably represents a hydrogen atom, an alkyl group having 1 to 8 carbon atoms or an aryl group having 6 to 15 carbon atoms. $L_{10}$, $L_{11}$ and $L_{12}$ may be the same or different and each represents a single bond or a divalent aliphatic or aromatic hydrocarbon group, which may have a substituent (preferably, for instance, alkyl, aralkyl, aryl, alkoxy groups and/or halogen atoms) and preferably represents an alkylene group having 1 to 20 carbon atoms or an arylene group having 6 to 15 carbon atoms and more preferably an alkylene group having 1 to 8 carbon atoms. If necessary, $L_{10}$, $L_{11}$ and $L_{12}$ may comprise other functional groups such as carbonyl, ester, urethane, amide, ureide and/or ether groups, which do not react with isocyanate groups. In this connection, two or three of $R_1$, $L_{10}$, $L_{11}$ and $L_{12}$ may form a ring together.

Ar represents a trivalent aromatic hydrocarbon group, which may have a substituent and preferably an aromatic group having 6 to 15 carbon atoms. $Z_0$ represents a group represented by the following general formula:

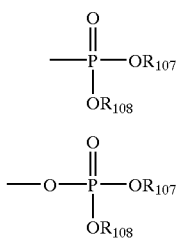

wherein $R_{107}$ and $R_{108}$ may be the same or different and each represents a hydrogen, sodium or potassium atom, or an alkyl or aryl group, with a hydrogen atom, an alkyl group having 1 to 8 carbon atoms or an aryl group having 6 to 15 carbon atoms being preferred.

The diol compound having a phosphonic acid residue, a phosphoric acid residue and/or an ester group of the acid, represented by the foregoing the formula (23), (24) or (25) may be prepared by, for instance, a method detailed below: After protecting the hydroxyl group of a halogen atom-containing compound represented by the following formula (26), (27), (28) at need, the compound is converted into a phosphonate ester according to the Michaelis-Arbuzov reaction represented by the scheme (29) and further the resulting ester is hydrolyzed with, for instance, hydrogen bromide to thus synthesize an intended diol compound.

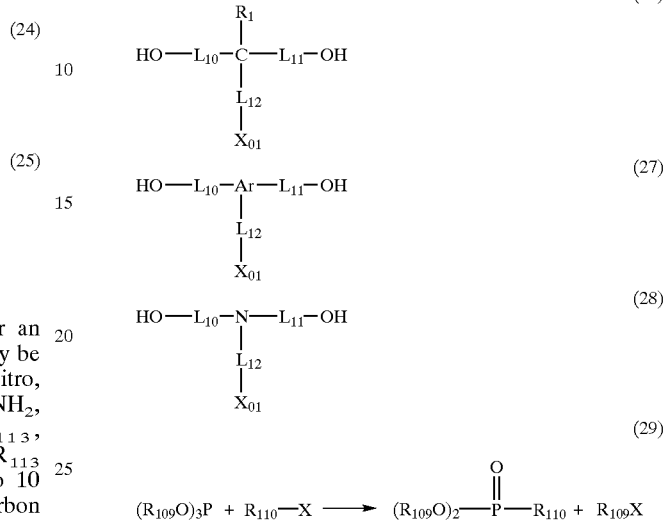

In these formulas, $R_1$, $L_{10}$, $L_{11}$, $L_{12}$ and Ar are the same as those defined above in connection with the general formulas (23), (24) and (25). $R_{109}$ represents an alkyl or aryl group, and preferably an alkyl group having 1 to 8 carbon atoms or an aryl group having 6 to 15 carbon atoms. $R_{110}$ is a residue represented by the formula (26), (27) or (28) from which $X_{01}$ is removed and $X_{01}$ represents a halogen atom and preferably Cl, Br or I.

Alternatively, the diol compound can likewise be prepared by a method, which comprises the steps of reacting the foregoing diol with phosphorus oxychloride and then hydrolyzing the resulting reaction product according to the reaction scheme

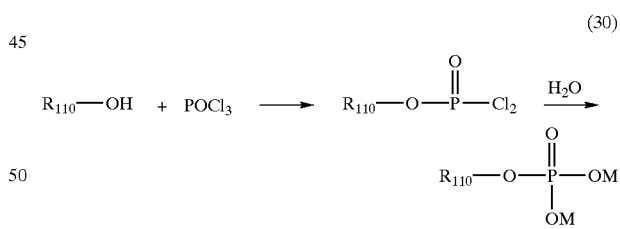

(30)

In the formula, $R_{110}$ is the same as that defined above in connection with the scheme (29) and M is a hydrogen, sodium or potassium atom.

When the polyurethane resin has a phosphonic acid residue, a diisocyanate compound represented by the formula (1) is reacted with a diol compound having a phosphonic acid ester residue and represented by the formula (23), (24) or (25) to give a polyurethane resin and then hydrolyzing the resin with, for instance, hydrogen bromide.

Moreover, the following amino group-containing compound may be incorporated into the structure of the polyurethane resin by reacting the same with a diisocyanate compound of the formula (1) like the diol compound.

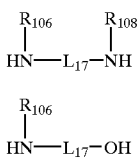

$$\underset{HN-L_{17}-NH}{\overset{R_{106}\quad R_{108}}{|\quad\quad|}} \quad (31)$$

$$\underset{HN-L_{17}-OH}{\overset{R_{106}}{|}} \quad (32)$$

In these formulas, $R_{106}$ and $R_{108}$ may be the same or different and each represents a hydrogen atom, or an alkyl, aralkyl or aryl group, which may have a substituent (such as alkoxy groups, halogen atoms (—F, —Cl, —Br, —I), ester residues and/or carboxyl groups) and preferably represents a hydrogen atom or an alkyl group having 1 to 8 carbon atoms or an aryl group having 6 to 15 carbon atoms, which may have a carboxyl group as a substituent. $L_{17}$ represents a divalent aliphatic or aromatic hydrocarbon group or a heterocyclic group, which may have a substituent (such as an alkyl, aralkyl, aryl, alkoxy or aryloxy group, a halogen atom (—F, —Cl, —Br, —I) or a carboxyl group). The group $L_{17}$ may, if necessary, comprise another functional group, which never reacts with the isocyanate group, such as a carbonyl, ester, urethane or amide group. In this connection, two of the groups $R_{106}$, $L_{17}$ and $R_{108}$ may form a ring together.

Specific examples of the compounds represented by the formulas (31) and (32) include aliphatic diamine compounds such as ethylene diamine, propylene diamine, tetramethylene diamine, pentamethylene diamine, hexamethylene diamine, heptamethylene diamine, octamethylene diamine, dodecamethylene diamine, propane-1,2-diamine, bis(3-aminopropyl)methylamine, 1,3-bis(3-aminopropyl) tetramethyl siloxane, piperazine, 2,5-dimethyl piperazine, N-(2-aminoethyl) piperazine, 4-amino-2,2,6,6-tetramethyl piperidine, N,N-dimethyl ethylenediamine, lysine, L-cystine and isophorone diamine; aromatic diamine compounds such as o-phenylene diamine, m-phenylene diamine, p-phenylene diamine, 2,4-tolyene diamine, benzidine, o-ditoluidine, o-dianisidine, 4-nitro-m-phenylene diamine, 2,5-dimethoxy-p-phenylene diamine, bis(4-aminophenyl) sulfone, 4-carboxy-o-phenylene diamine, 3-carboxy-m-phenylene diamine, 4,4'-diaminophenyl ether and 1,8-naphthalene diamine; heterocyclic amine compounds such as 2-aminoimidazole, 3-aminotriazole, 5-amino-1H-tetrazole, 4-aminopyrazole, 2-aminobenzimidazole, 2-amino-5-carboxy-triazole, 2,4-diamino-6-methyl-S-triazine, 2,6-diaminopyridine, L-histidine, DL-tryptophane and adenine; and aminoalcohol or aminophenol compounds such as ethanolamine, N-methyl ethanolamine, N-ethyl ethanolamine, 1-amino-2-propanol, 1-amino-3-propanol, 2-aminoethoxy ethanol, 2-aminothioethoxy ethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzyl amine, 4-amino-1-naphthol, 4-aminosalicylic acid, 4-hydroxy-N-phenyl glycine, 2-aminobenzyl alcohol, 4-aminophenethyl alcohol, 2-carboxy-5-amino-1-naphthol and L-tyrosine.

The polyurethane resin can be synthesized by dissolving the foregoing isocyanate compound and the diol compound in a nonprotic solvent, adding a known catalyst having an activity corresponding to the reactivity of each reaction system and then heating. The molar ratio of the diisocyanate to the diol compound used preferably ranges from 0.8:1 to 1.2:1. In this respect, if isocyanate groups remain at the terminals of the resulting polymer, the latter is treated with, for instance, alcohols or amines to thus finally synthesize a polymer free of any isocyanate group thereon.

The polyurethane resin should contain carboxyl groups of not less than 0.4 meq/g and in particular, it is preferred that the polymer contains carboxyl groups in an amount ranging from 0.4 to 3.5 meq/g.

The molecular weight of the polyurethane resin is preferably not less than 1000 and more preferably 5000 to 500,000 as expressed in terms of the weight average molecular weight.

These high molecular weight compounds may be used alone or in any combination. The content of these high molecular weight compounds in the light-sensitive composition ranges from about 5 to 95% by weight and preferably about 10 to 90% by weight.

Specific examples of more preferred polyurethane resins are those listed below, but the present invention is not restricted to these specific examples at all. Most of the specific examples listed below are represented by the combination of diisocyanate and diol compounds used. In addition, the content of carboxyl groups is given as the acid value of each specific polymer.

| Poly(urethane-urea)Resin | 1-4(1/2) Diisocyanate Compound (mole %) | | |
|---|---|---|---|
| (1) | OCN—⟨C6H4⟩—CH2—⟨C6H4⟩—NCO (50) + OCN—(CH2)6—NCO (50) | | |
| (2) | OCN—(CH2)6—NCO (100) | | |
| (3) | OCN—(CH2)6—NCO (100) | | |
| (4) | OCN—⟨C6H4⟩—CH2—⟨C6H4⟩—NCO (100) | | |

| Poly(urethane-urea)Resin | 1-4(2/2) Diol Compound and Diamine, Aminoalcohol or Urea Compound (mole %) | Acid Value (meq/g) |
|---|---|---|
| (1) | HO—CH2—C(CH3)(COOH)—CH2—OH (45) + 2,4-diamino toluene (30) + HO—(CH2CH2—O)2—H (25) | 1.33 |
| (2) | 3,5-dihydroxybenzoic acid (40) + 2,4-diamino toluene (30) + HO—(CH2)6—OH (30) | 1.28 |

-continued (3) HO—CH₂—C(CH₃)(COOH)—CH₂—OH +

(1,3-diaminobenzene) (30)

+ HO—CH₂CH₂—SO₂—CH₂CH₂—OH (30)  1.25

(40)

(4) HO—CH₂—C(CH₃)(COOH)—CH₂—OH + piperazine (HN⟨⟩NH) (10) + HO—(CH₂)₆—OH (40)  1.30

(50)

5~8(1/2)

| Poly(urethane-urea)Resin | Diisocyanate Compound (mole %) |
|---|---|

(5) 3,3'-dimethyl-4,4'-diisocyanatobiphenyl (50) + OCN—(CH₂)₆—NCO (50)

(6) 4,4'-diisocyanatodiphenylmethane (50) + isophorone diisocyanate type structure (H₃C,CH₃ cyclohexane with CH₂—NCO and NCO) (50)

(7) 3,3'-dimethyl-4,4'-diisocyanatobiphenyl (40) + OCN—(CH₂)₆—NCO (60)

-continued
| Poly(urethane-urea)Resin | Diol Compound and Diamine, Aminoalcohol or Urea Compound (mole %) | Acid Value (meq/g) |
|---|---|---|
| (8) |  (100) | |
5~8(2/2)
| Poly(urethane-urea)Resin | Diol Compound and Diamine, Aminoalcohol or Urea Compound (mole %) | Acid Value (meq/g) |
|---|---|---|
| (5) |  | 1.37 |
| (6) | 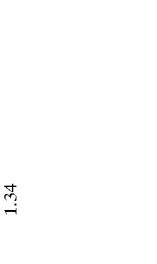 | 1.34 |
| (7) |  | 1.26 |
| (8) | 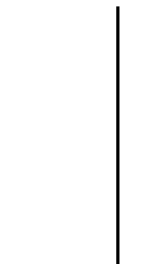 | 1.25 |
9~11(1/2)
| Poly(urethane-urea)Resin | Diisocyanate Compound (mole %) |
|---|---|

-continued

| Poly(urethane-urea)Resin | Diol Compound and Diamine, Aminoalcohol or Urea Compound (mole %) | Acid Value (meq/g) |
|---|---|---|
| (9) | 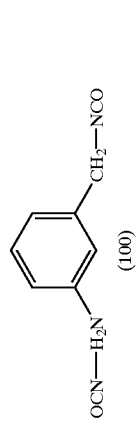 (100) | |
| (10) | 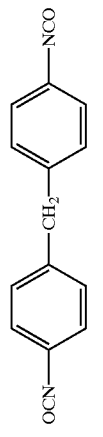 (100) | |
| (11) | 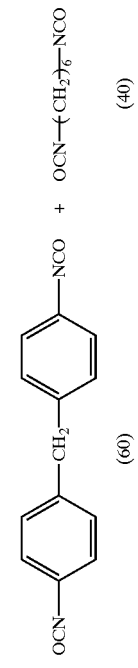 (60) + OCN—(CH$_2$)$_6$—NCO (40) | |

9~11(2/2)

| Poly(urethane-urea)Resin | Diol Compound and Diamine, Aminoalcohol or Urea Compound (mole %) | Acid Value (meq/g) |
|---|---|---|
| (9) | HO—CH$_2$—C(CH$_3$)(COOH)—CH$_2$—OH (60) + HO—CH$_2$CH$_2$—NHCONH—[tolyl-CH$_3$]—NHCONH—CH$_2$CH$_2$—OH (40) | 1.50 |
| (10) | HO—CH$_2$—C(CH$_3$)(COOH)—CH$_2$—OH (60) + HO—CH$_2$CH$_2$—NHCONH—(CH$_2$)$_6$—NHCONH—CH$_2$CH$_2$—OH (40) | 1.30 |
| (11) | HO—CH$_2$—C(CH$_3$)(COOH)—CH$_2$—OH (60) + HO—CH$_2$CH$_2$—NHCONHCH$_2$—[phenyl]—CH$_2$NHCONH—CH$_2$CH$_2$—OH (40) | 1.38 |

-continued

12-19(1/2)

| Poly(urethane-ester)Resin | Diisocyanate Compound (mole %) |
|---|---|
| (12) | OCN–C₆H₄–CH₂–C₆H₄–NCO (50) + OCN–(CH₂)₆–NCO (50) |
| (13) | OCN–(CH₂)₆–NCO (100) |
| (14) | 1,5-naphthalene diisocyanate (100) |
| (15) | OCN–C₆H₄–CH₂–C₆H₄–NCO (60) + 1,3-bis(isocyanatomethyl)benzene (40) |
| (16) | 3,3'-dimethyl-4,4'-biphenyl diisocyanate (70) + OCN–(CH₂)₆–NCO (30) |
| (17) | OCN–C₆H₄–CH₂–C₆H₄–NCO (70) + 5-isocyanato-1-(isocyanatomethyl)-1,3,3-trimethylcyclohexane (30) |

-continued

(18) H₃C—[benzene]—[benzene]—NCO with CH₃ substituent + OCN—(CH₂)₆—NCO
OCN (40) (30)

(19) OCN—[benzene with CH₃]—NCO (100)

12–19(2/2)

| Poly(urethane-ester)Resin | Diol Compound (mole %) | Acid Value (meq/g) |
|---|---|---|
| (12) | HO—CH₂—C(CH₃)(COOH)—CH₂—OH (50) + [phthalate: benzene-1,2-di(COO—CH₂CH₂—OH)] (50) | 1.21 |
| (13) | [benzene-1,3-di(COO—CH₂CH₂—OH)] (60) + [3,5-dihydroxybenzoic acid: HO—C₆H₃(OH)—COOH] (40) | 1.03 |
| (14) | HO—CH₂—C(CH₃)(COOH)—CH₂—OH (50) + HO—CH₂CH₂—O—CO—CH=CH—COO—CH₂CH₂—OH (50) | 1.28 |
| (15) | HO—CH₂—C(CH₃)(COOH)—CH₂—OH (50) + HO—CH₂CH₂—O—CO—(CH₂)₄—COO—CH₂CH₂—OH (50) | 1.20 |

-continued

| Poly(urethane-ester)Resin | | Acid Value (meq/g) |
|---|---|---|
| (16) | HO—CH$_2$—C(CH$_3$)(COOH)—CH$_2$—OH + HO—CH$_2$CH$_2$—O—CO—CH$_2$—O—CH$_2$—COO—CH$_2$CH$_2$—OH (50) (50) | 1.19 |
| (17) | HO—CH$_2$—C(CH$_3$)(COOH)—CH$_2$—OH + cyclohexane-1,2-bis(COO—CH$_2$CH$_2$—OH) (50) (50) | 1.11 |
| (18) | HO—(4-hydroxyphenyl)CH(COOH)(4-hydroxyphenyl) (50) | 1.24 |
| (19) | HO—CH$_2$—C(CH$_3$)(COOH)—CH$_2$—OH + 2-(2-hydroxyphenoxy)benzoate-CH$_2$CH$_2$—OH derivative (50) (50) | 1.25 |

| Poly(urethane-ester)Resin | Diol Compound (mole %) | Diisocyanate Compound (mole %) | Acid Value (meq/g) |
|---|---|---|---|
| (20) | HO—CH$_2$—C(CH$_3$)(COOH)—CH$_2$—OH (55) + HO—CH$_2$CH$_2$—O—CO—(CH$_2$)$_3$—COO—CH$_2$CH$_2$—OH (45) | m-xylylene diisocyanate (OCN—H$_2$C—C$_6$H$_4$—CH$_2$—NCO) (100) | 1.38 |

-continued

| Poly(urethane-amine)Resin | Diisocyanate Compound (mole %) | Diol Compound (mole %) | Acid Value (meq/g) |
|---|---|---|---|
| (21) | OCN—C₆H₄—CH₂—C₆H₄—NCO (50) + OCN—(CH₂)₆—NCO (50) | HO—CH₂—C(CH₃)(COOH)—CH₂—OH (50) + HO—C₆H₃(m)—CO—NH—CH₂CH₂—OH, CO—NH—CH₂CH₂—OH (50) | 1.22 |
| (22) | OCN—(CH₂)₆—NCO (100) | 3,5-dihydroxybenzoic acid (HO—C₆H₃(OH)—COOH) (40) + HO—CH₂CH₂—NH—CO—CH=CH—CO—NH—CH₂CH₂—OH (60) | 1.12 |
| (23) | m-xylylene diisocyanate (OCN—CH₂—C₆H₄—CH₂—NCO) (100) | HO—CH₂CH₂—N(CH₂CH₂COOH)—CH₂CH₂—OH (50) + HO—CH₂CH₂—NH—CO—(CH₂)₂—CO—NH—CH₂CH₂—OH (50) | 1.25 |
| (24) | 1,5-naphthalene diisocyanate (100) | HO—CH₂—C(CH₃)(COOH)—CH₂—OH (50) + HO—CH₂CH₂—NH—CO—(CH₂)₃—CO—NH—CH₂CH₂—OH (50) | 1.23 |

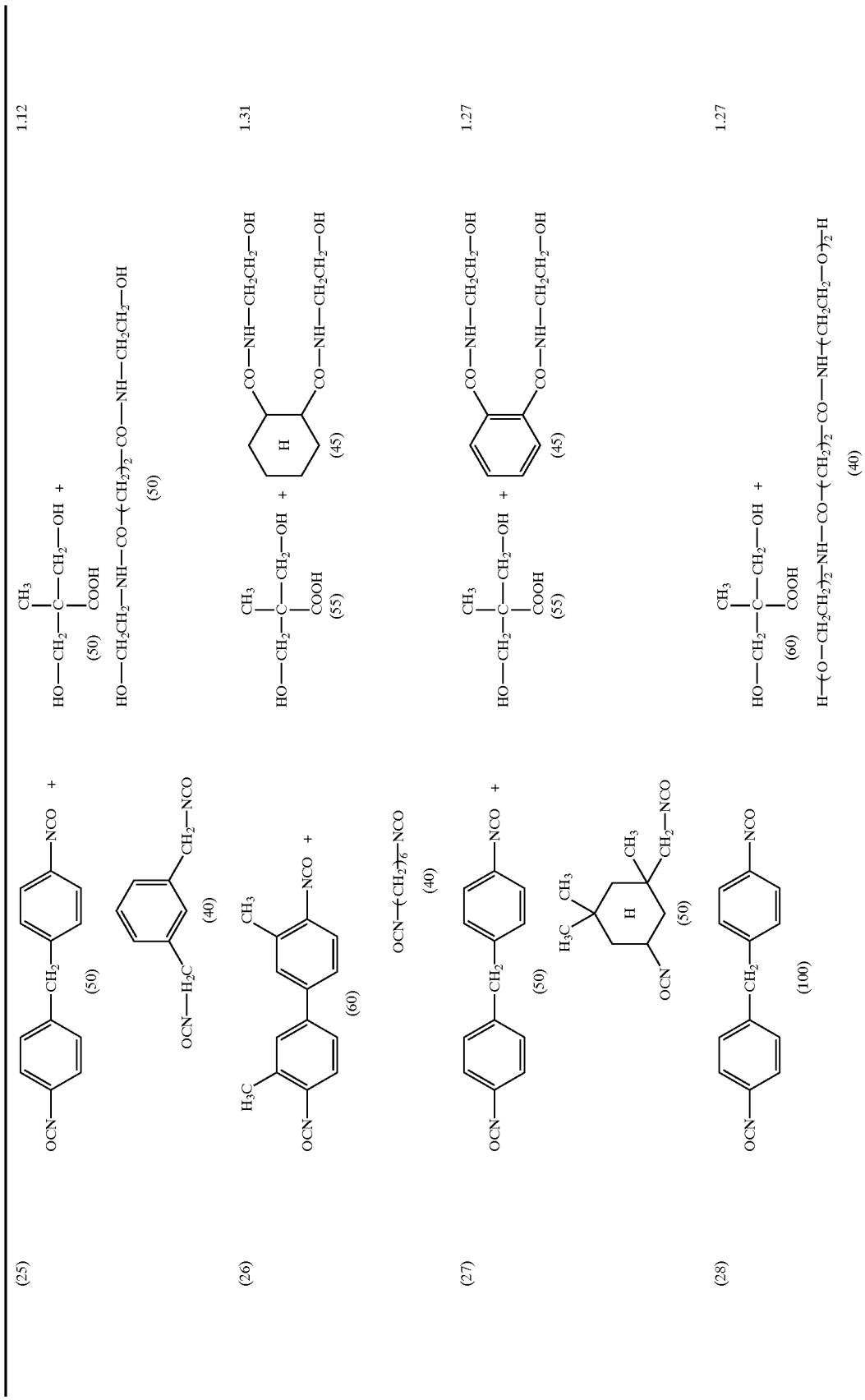

-continued
| Polyurethane Resine | Diisocyanate Compound (mole %) | Diol Compound (mole %) | Acid Value (meq/g) |
|---|---|---|---|
| (29) | 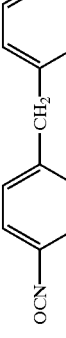 |  | 1.24 |
| (30) | 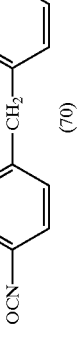 |  | 1.27 |
| (31) | 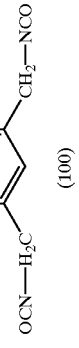 |  | 1.13 |
| (32) |  |  | 1.26 |

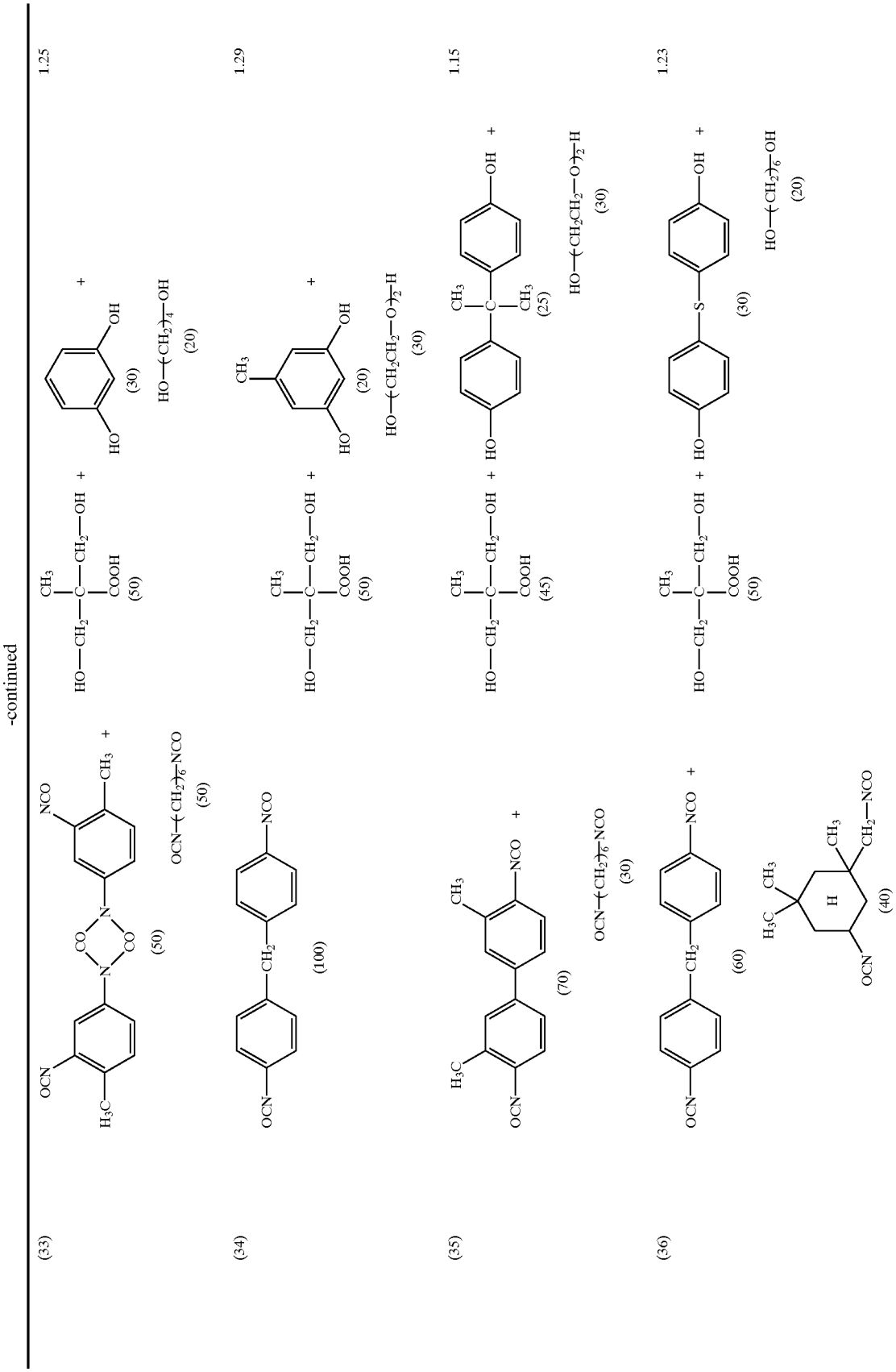

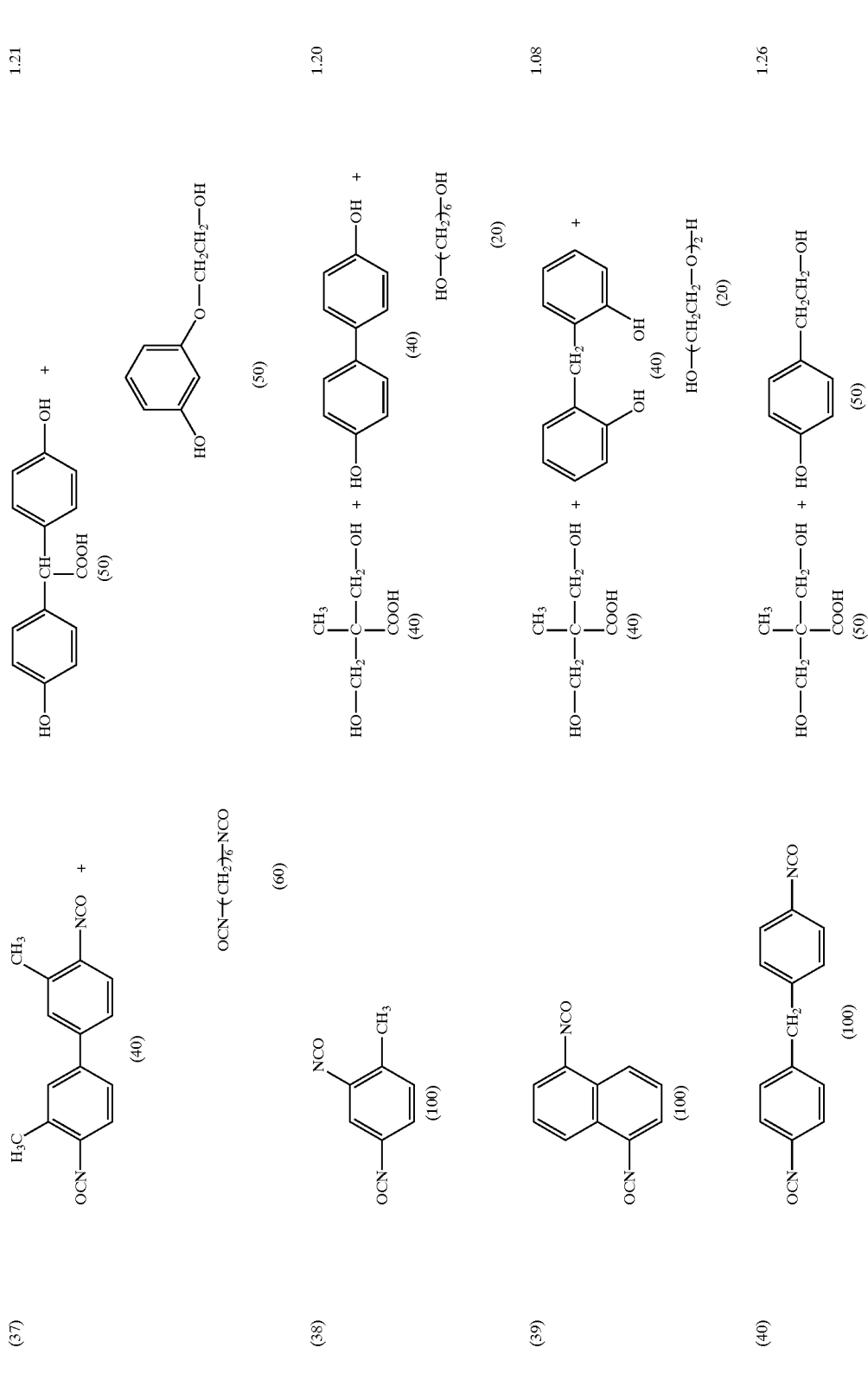

-continued (41)

Structures shown: diisocyanate reaction with diol
OCN–C₆H₄–CH₂–C₆H₄–NCO + HO–CH₂–C(CH₃)(COOH)–CH₂–OH + HO–CH₂–C₆H₄–OH (60)

Acid Value: 1.16

OCN–(CH₂)₆–NCO (50)

| Polyurethane Resine | Structure (mol %) | Acid Value (meq/g) |
|---|---|---|
| (42) | [polymer structure with CH₂–NHCO (15), CONH–CH₂ (35), NHCO–C₆H₄–CH₂–C₆H₄–CONH, O–CH₂CH₂–OOC–C₆H₂(COOH)(COO–)–OCO–CH₂CH₂–O (25), O–CH₂–C(CH₃)₂–CH₂–O (15)] | 2.18 |
| (43) | [polymer structure with CH₂–NHCO (15), CONH–CH₂ (35), NHCO–C₆H₄–CH₂–C₆H₄–CONH, O–CH₂CH₂–OOC–C₆H₂(COOR)(COO–)–OCO–CH₂CH₂–O (25), O–CH₂–C(CH₃)₂–CH₂–O (15)] | 1.21 |

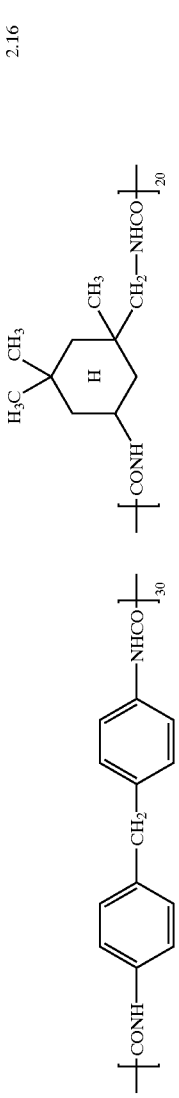

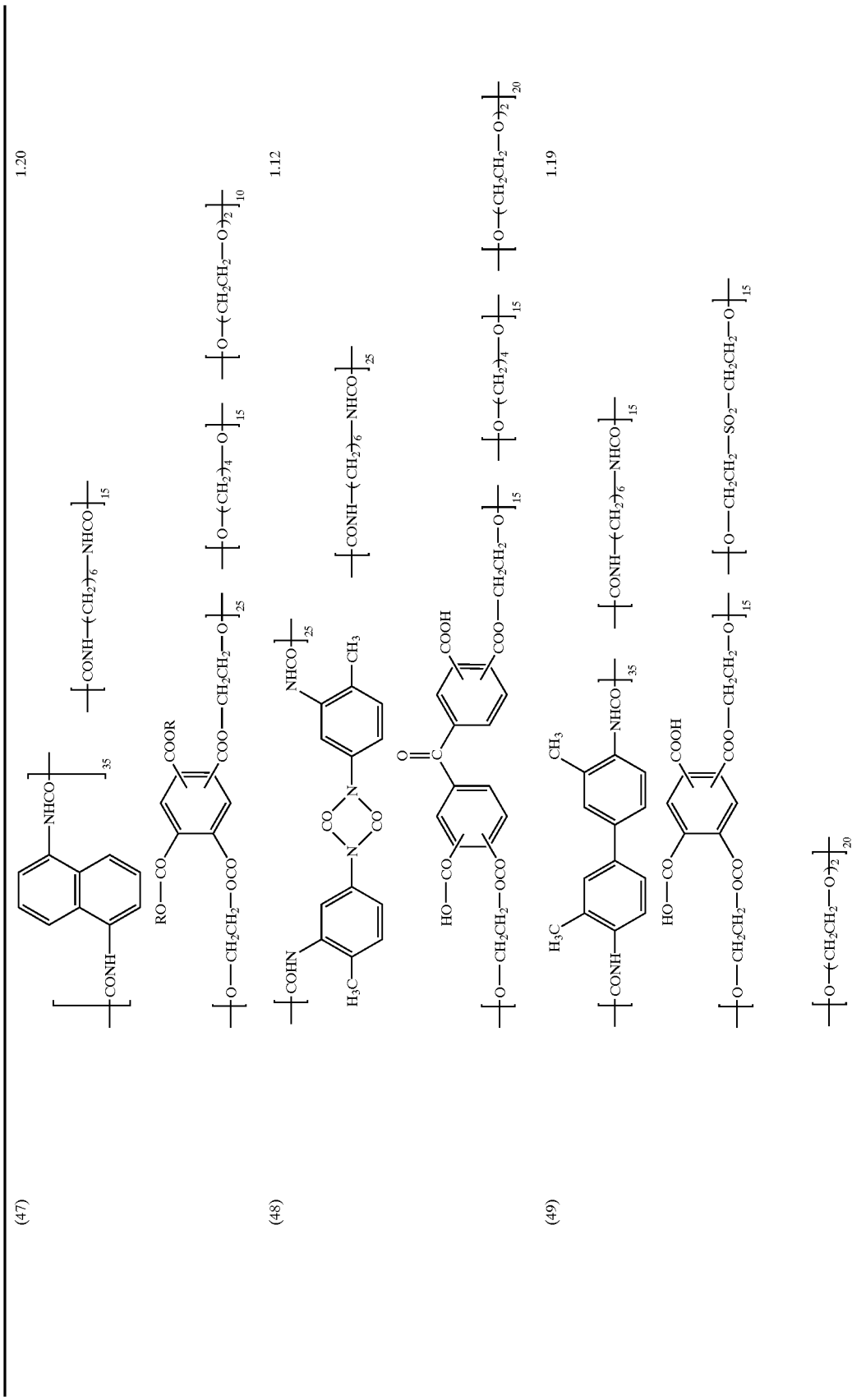

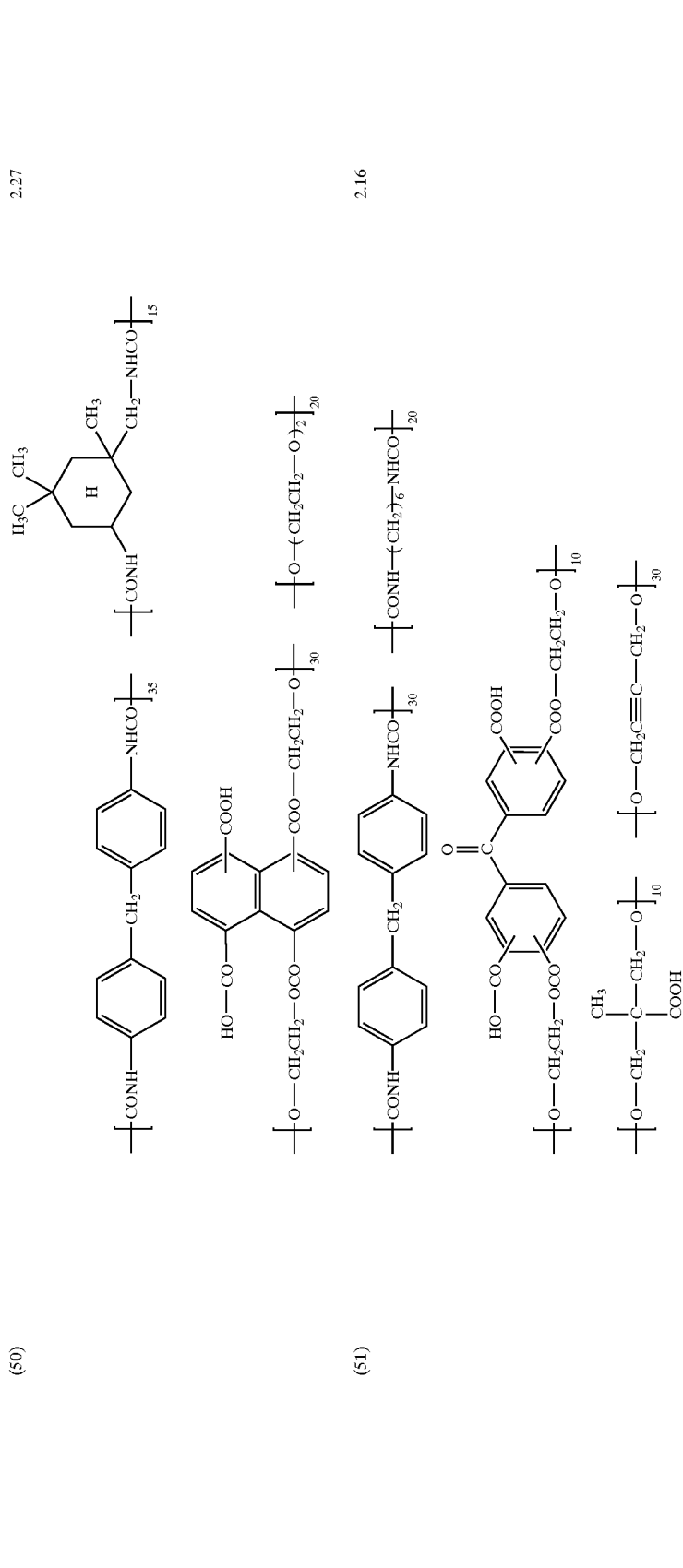

-continued

(52) [chemical structure with NHCO-phenyl-CH2-phenyl-CONH and CH2-NHCO-phenyl-CH2 groups, CONH with subscript 30 and 20] 1.25

[chemical structures: RO-CO-phenyl(COOR)(COO-CH2CH2-O)20, O-CH2CH2N(C=O-CH2CH2-COO-R)-CH2CH2-O with subscript 10, O-CH2-C≡C-CH2-O subscript 20]

(53) [chemical structures with NHCOO-CH2CH2-O subscript 30, phenyl-CH2-phenyl-CONH, O-CH2CH2-O-CONH-(CH2)6-NHCOO-CH2CH2-O subscript 10, cyclohexane with COOH and CO groups subscript 20] 1.30

| Polyurethane Resine | Diisocyanate Compound (mole %) | Phosphonic Acid, Phosphoric Acid or Ester group thereof-containing Diol Compound (mole %) | Other Diol Compound (mole %) | Acid Value (meq/g) |
|---|---|---|---|---|
| (54) | OCN—H2C—[phenyl]—CH2—NCO (100) | HO—CH2CH2—N(CH2—P(=O)(OH)2)—CH2CH2—OH + HO—CH2CH2—N(CH2—P(=O)(OC2H5)2)—CH2CH2—OH (30) | HO—CH2—C(CH3)(COOH)—CH2—OH (30) + HO—(CH2)6—OH (40) | 1.45 |

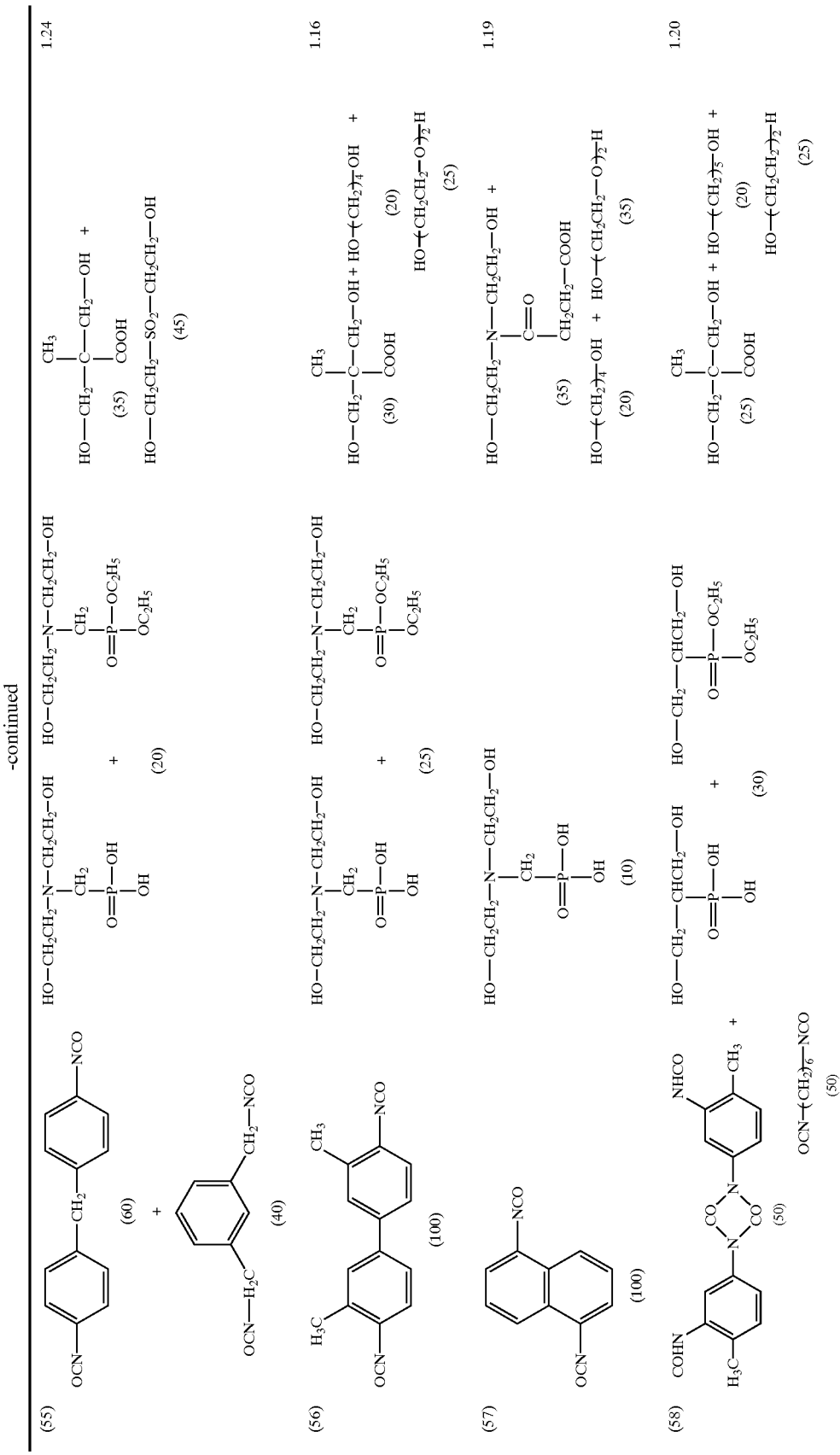

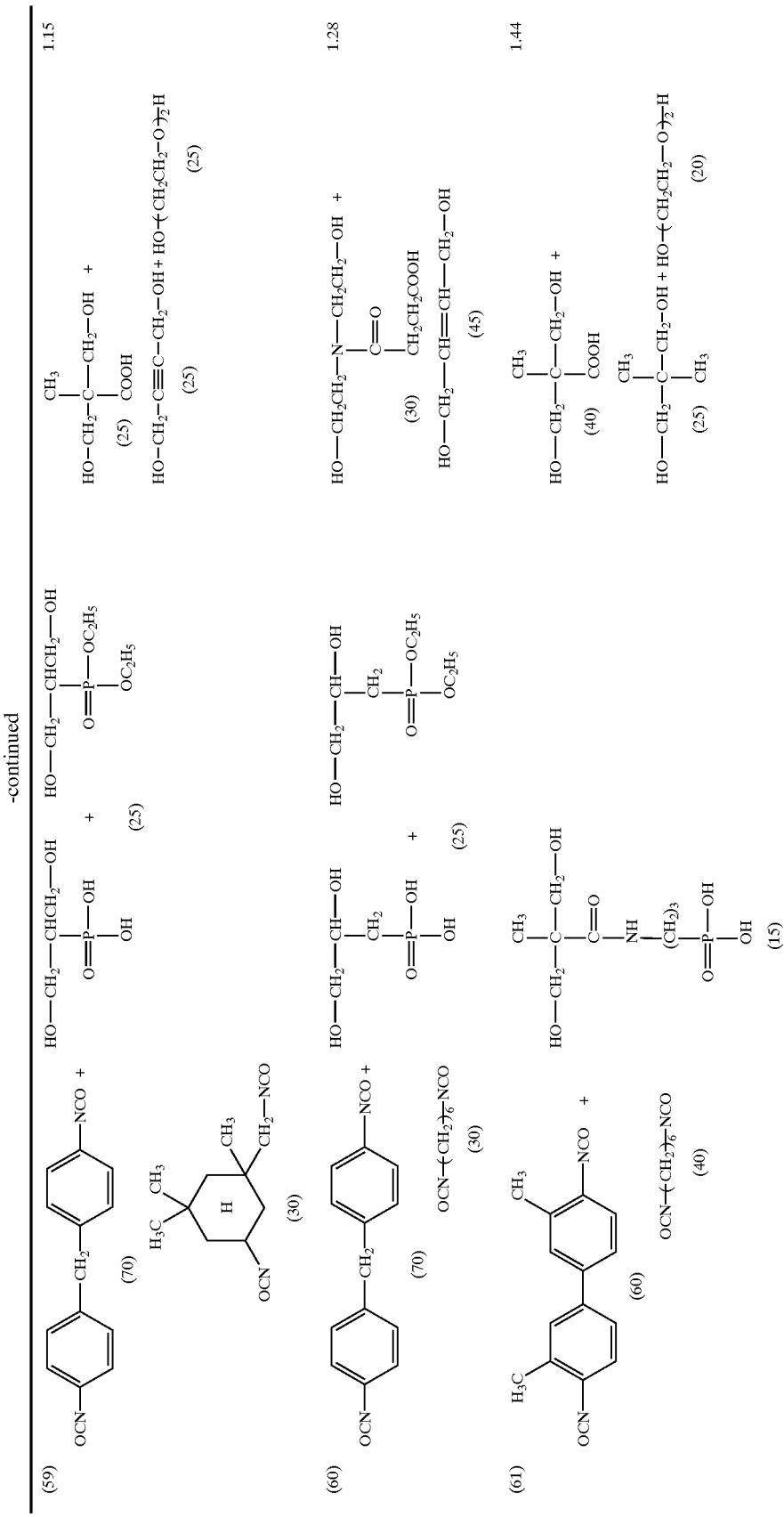

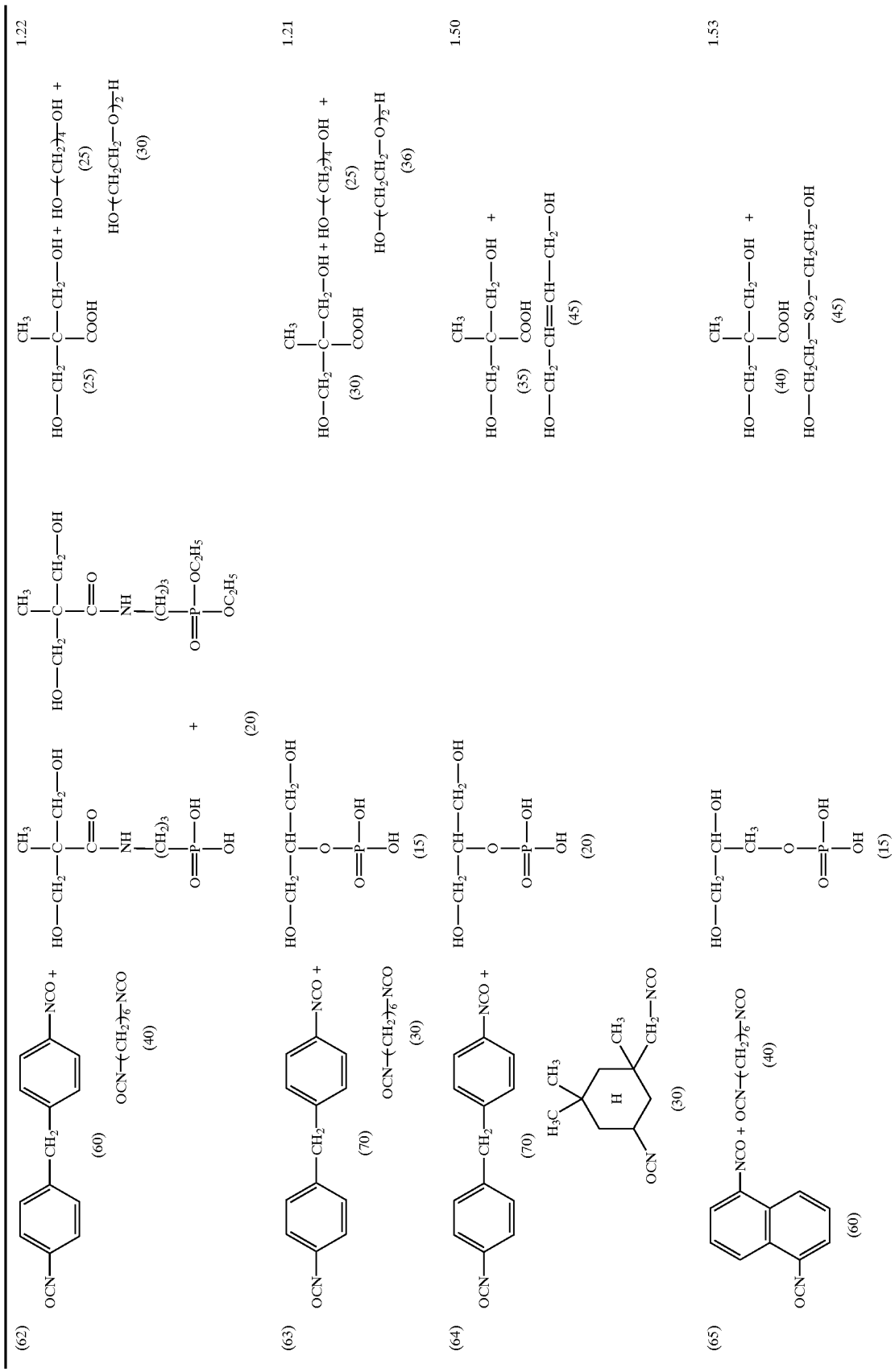

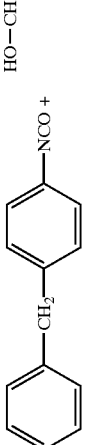

| Polyurethane Resine | Diol Compound (mole %) | | Acid Value (meq/g) |
|---|---|---|---|

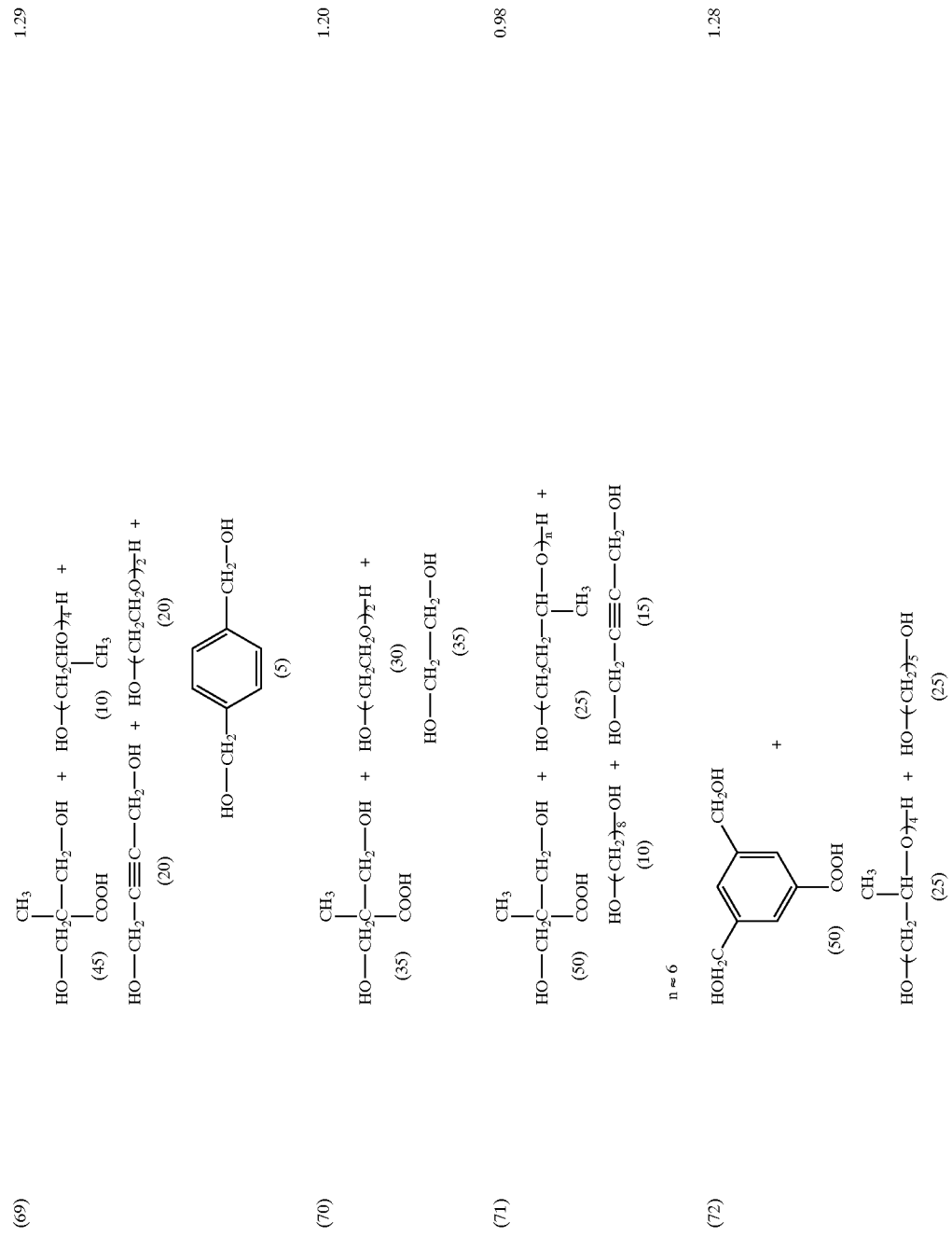

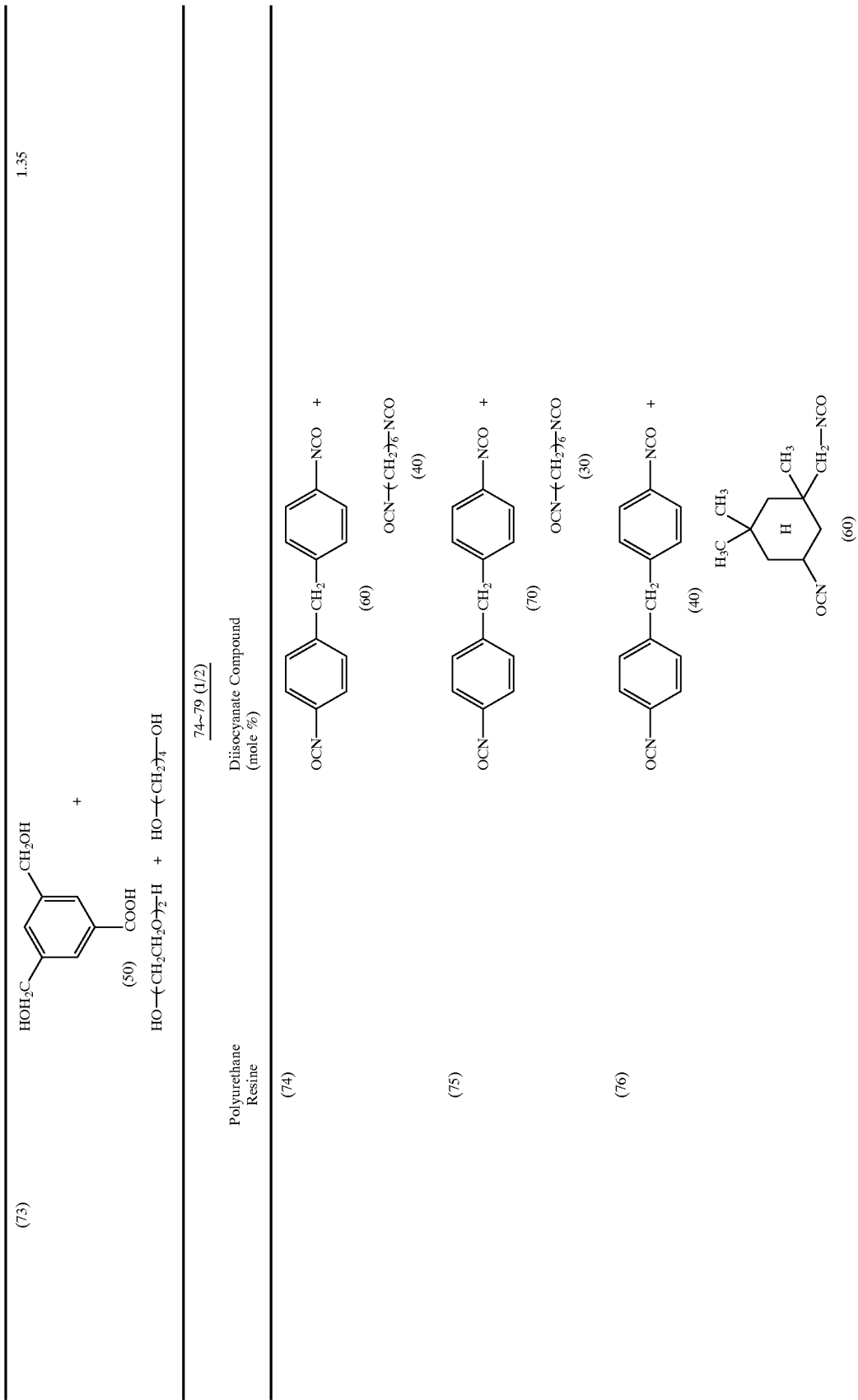

-continued
(77) 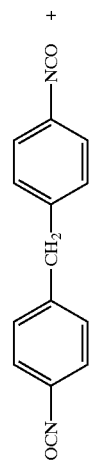 (70) + 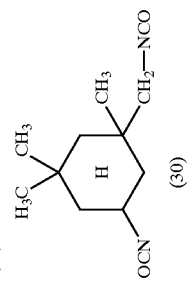 (30)
(78) 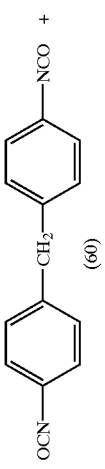 (60) + 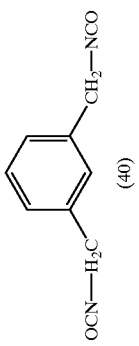 (40)
(79) 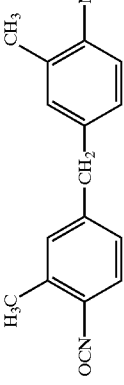 (60) + OCN—(CH₂)₆—NCO (40)
| Polyurethane Resine | Diol Compound (mole %) | | Acid Value (meq/g) |
|---|---|---|---|
| (74) | 74–79 (2/2) | | |
| | HO—CH₂—C(CH₃)(COOH)—CH₂—OH (40) + HO—(CH₂CH₂O)₇—H (35) + HO—(CH₂)₂—OH (25) | | 1.16 |

-continued

(75) $HO-CH_2\underset{\underset{COOH}{|}}{\overset{\overset{CH_3}{|}}{C}}-CH_2-OH \;+\; HO-(CH_2CH_2O)_2-H \;+\; HO-CH_2\underset{\underset{CH_3}{|}}{\overset{\overset{CH_3}{|}}{C}}-CH_2-OH$
(45) (35) (20)
1.23

(76) $HOH_2C\text{-}C_6H_3(CH_2OH)\text{-}COOH \;+\; HO-(CH_2CH_2O)_4-H \;+\; HO-(CH_2)_6-OH$
(45) (25) (30)
1.05

(77) $HO-CH_2\underset{\underset{COOH}{|}}{\overset{\overset{CH_3}{|}}{C}}-CH_2-OH \;+\; HO-(CH_2CH_2O)_2-H \;+\; HO-(CH_2)_4-OH$
(45) (35) (20)
1.18

(78) $HO-CH_2\underset{\underset{COOH}{|}}{\overset{\overset{CH_3}{|}}{C}}-CH_2-OH \;+\; HO-(CH_2CH_2O)_3-H \;+\; HO-CH_2\underset{\underset{CH_3}{|}}{\overset{\overset{CH_3}{|}}{C}}-CH_2-OH$
(40) (40) (20)
1.03

-continued

| Polyurethane Resine | Diisocyanate Compound (mole %) | Diol Compound (mole %) | Acid Value (meq/g) |
|---|---|---|---|
| (79) | | HO—CH$_2$C(CH$_3$)(COOH)—CH$_2$—OH (40) + HO—(CH$_2$CH$_2$O)$_2$—H (35) + HO—CH$_2$—CH=CH—CH$_2$—OH (25) | 1.10 |
| (80) | OCN—C$_6$H$_4$—CH$_2$—C$_6$H$_4$—NCO (70) + OCN—(CH$_2$)$_6$—NCO (30) | HO—CH$_2$C(CH$_3$)(COOH)—CH$_2$—OH (58) + Compound Example No. 10 (Hydroxyl Value 56.9 mg KOH/g) (10) + HO—CH$_2$CH$_2$—OH (32) | 1.03 |
| (81) | OCN—C$_6$H$_4$—CH$_2$—NCO (100) | 3,5-dihydroxybenzoic acid (80) + Compound Example No. 2 (Hydroxyl Value 54.7 mg KOH/g) (20) | 1.08 |
| (82) | OCN—C$_6$H$_4$—CH$_2$—C$_6$H$_4$—NCO (50) + OCN—CH$_2$—C$_6$H$_4$—CH$_2$—NCO (50) | HO—CH$_2$CH$_2$—N(COCH$_2$CH$_2$COOH)—CH$_2$CH$_2$—OH (85) + Compound Example No. 2 (Hydroxyl Value 54.7 mg KOH/g) (15) | 1.22 |

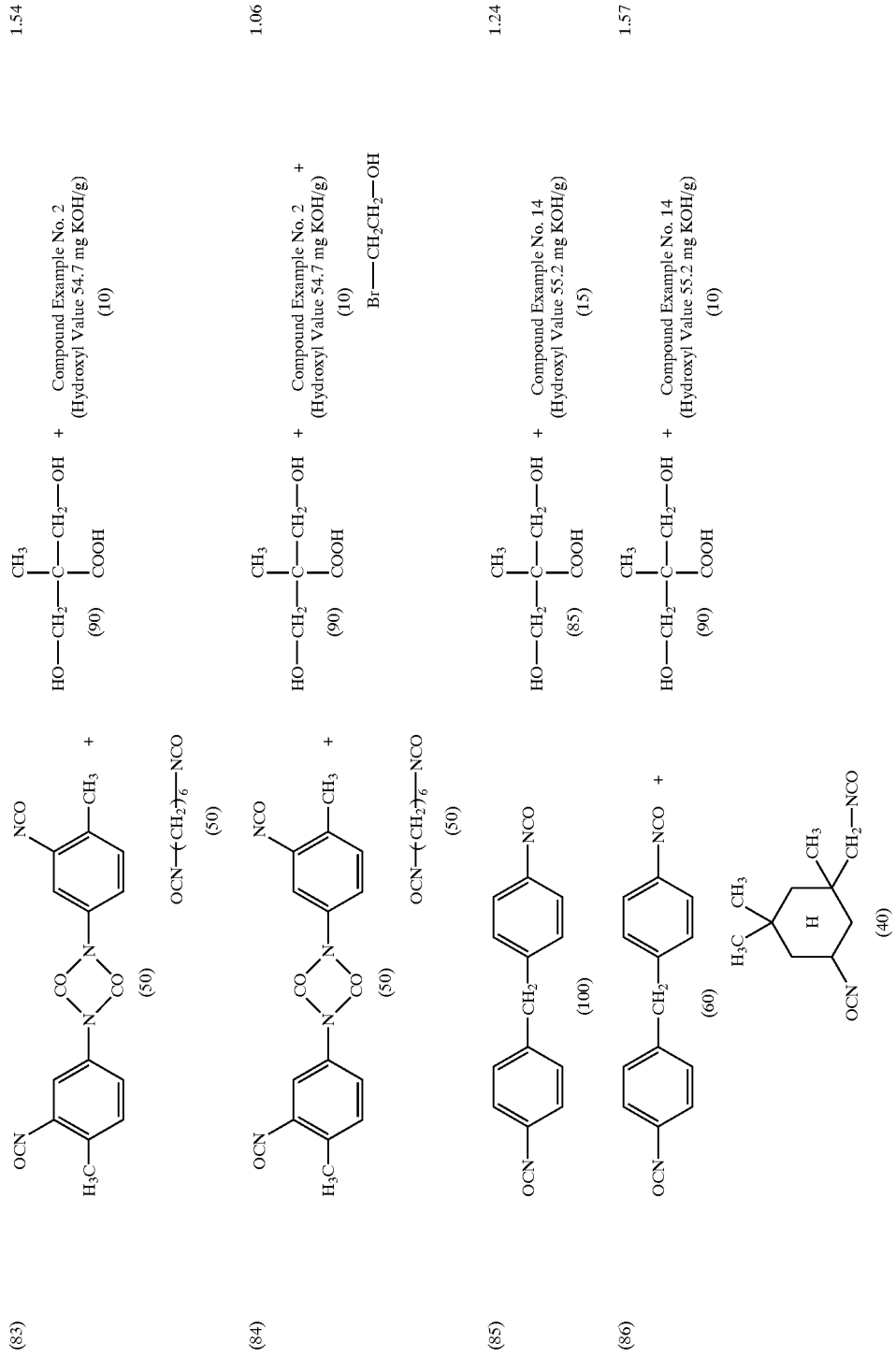

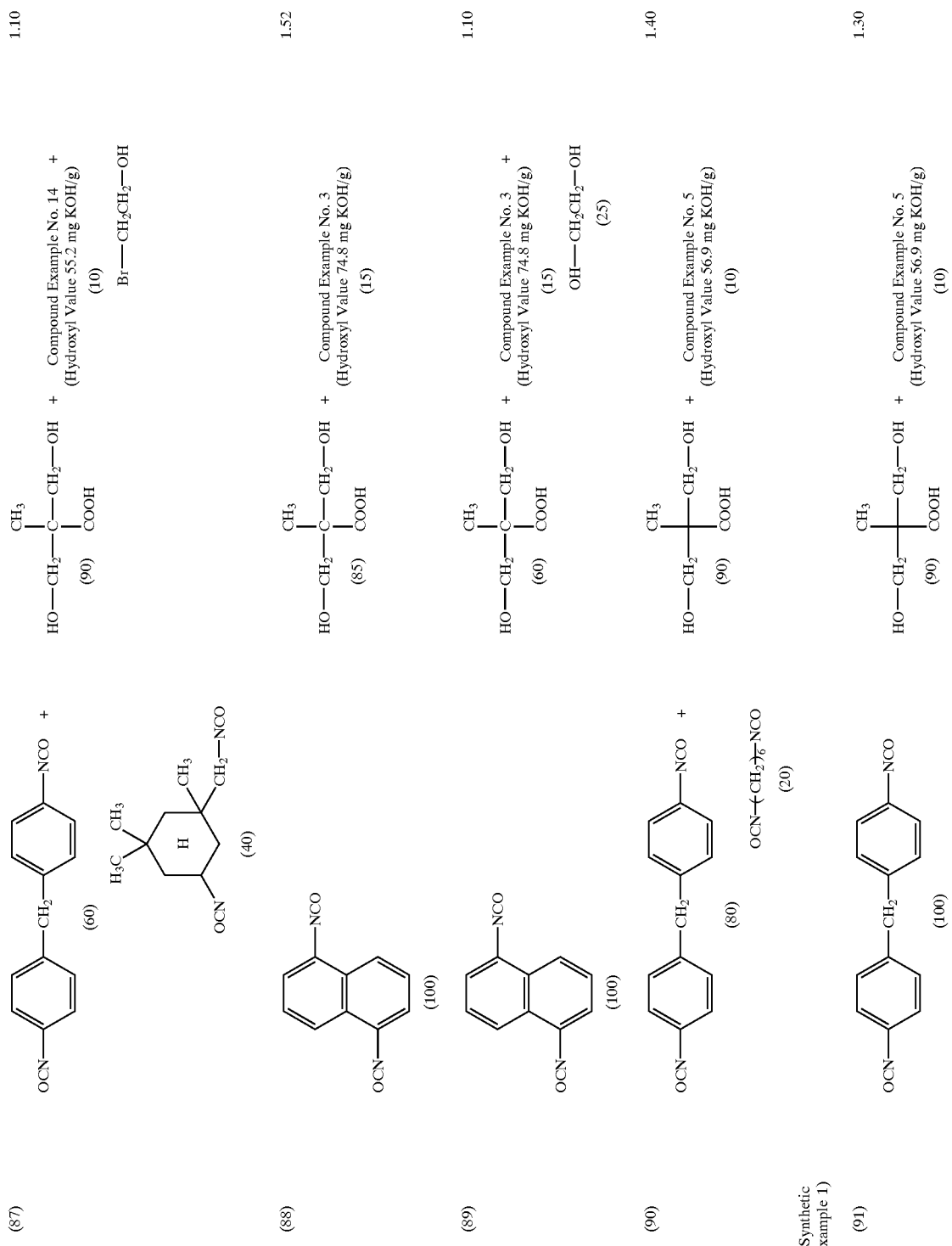

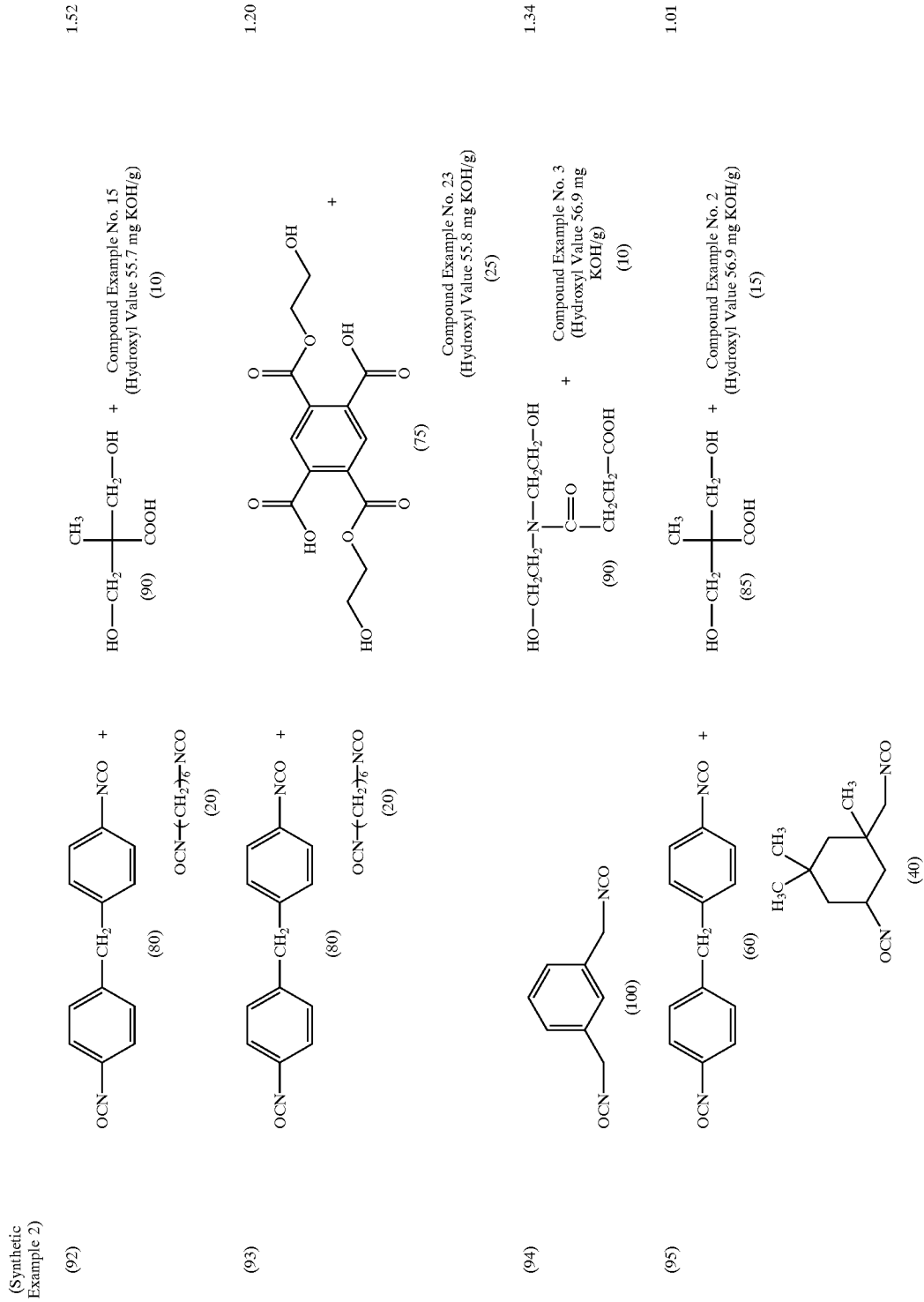

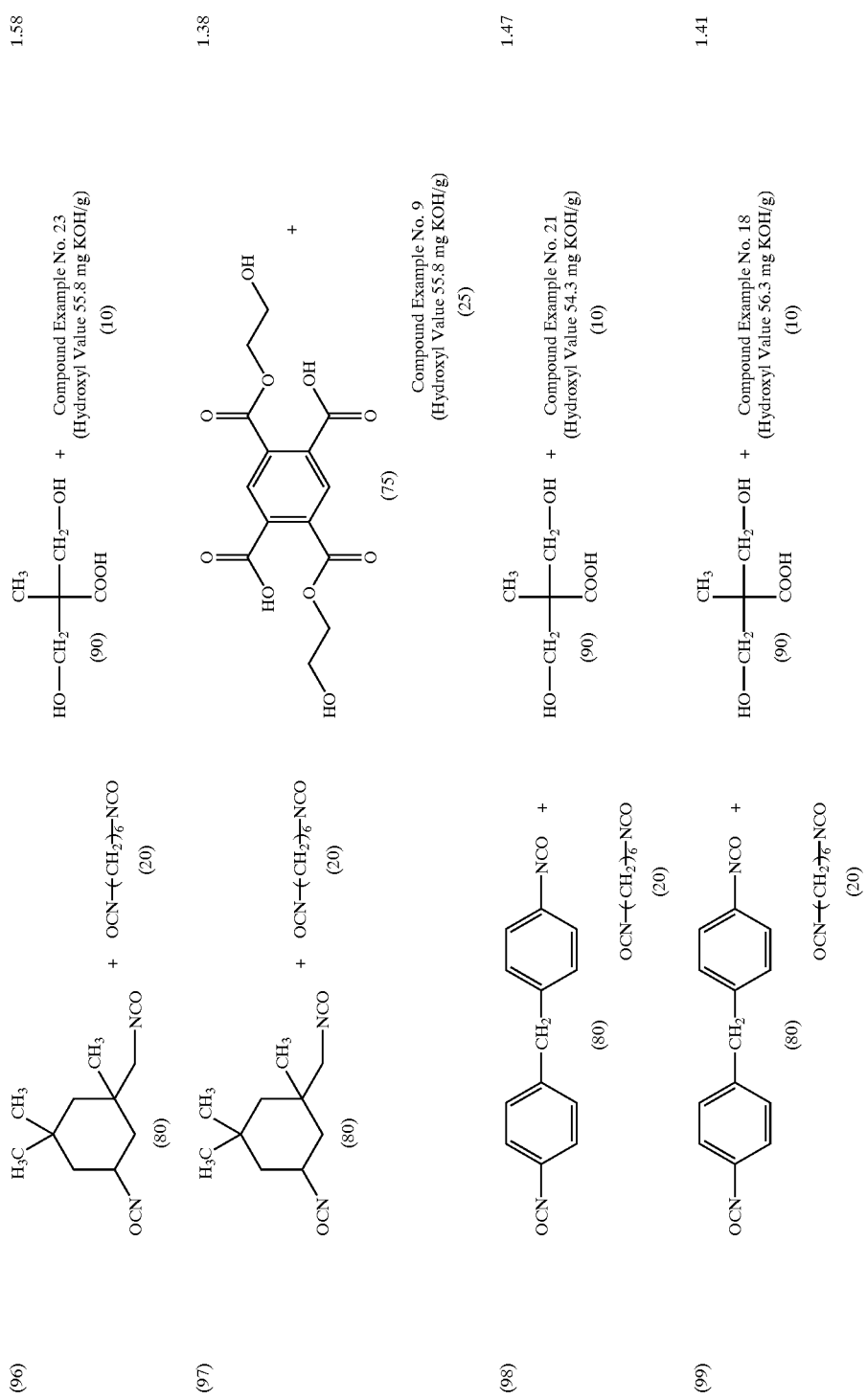

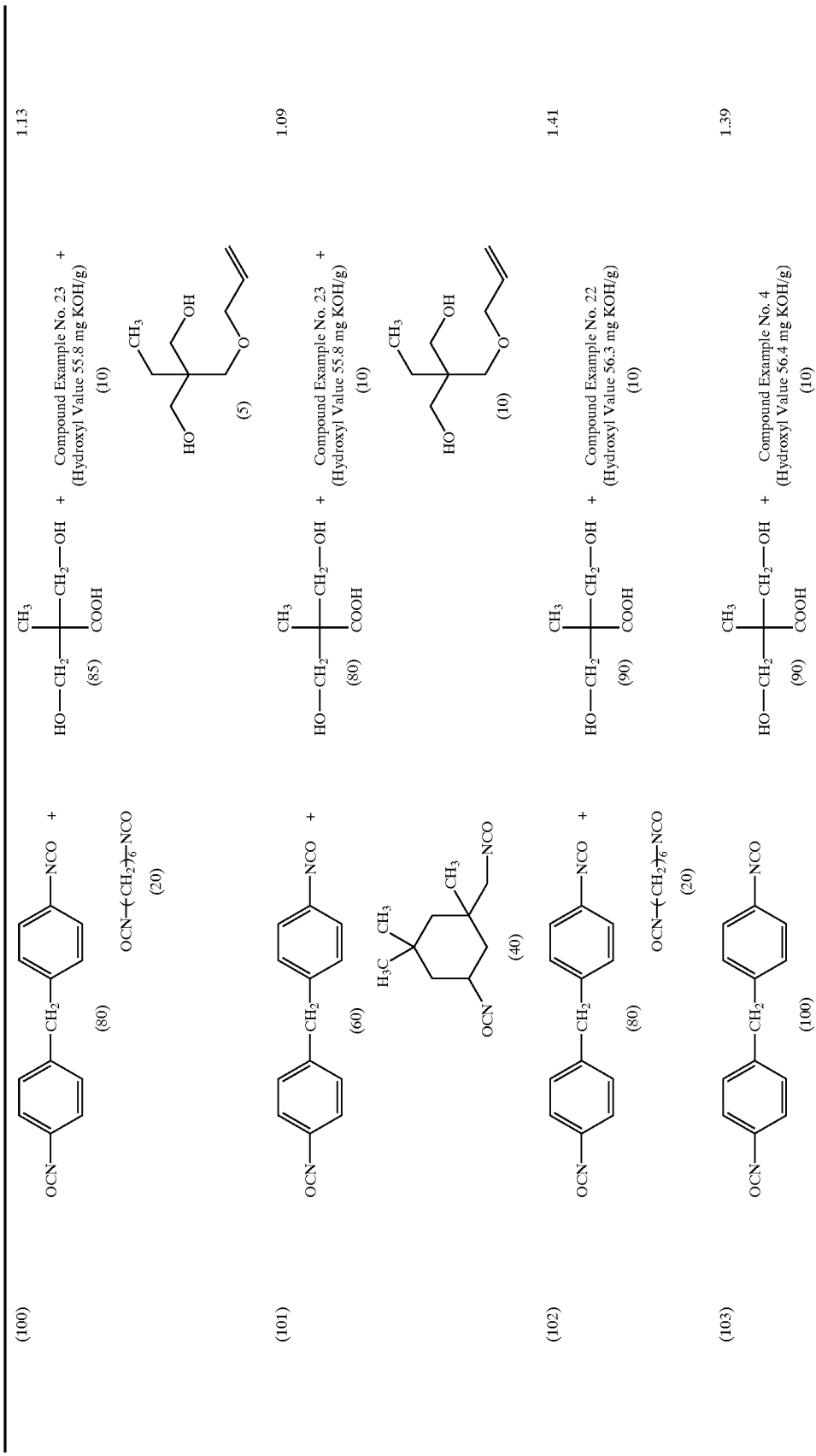

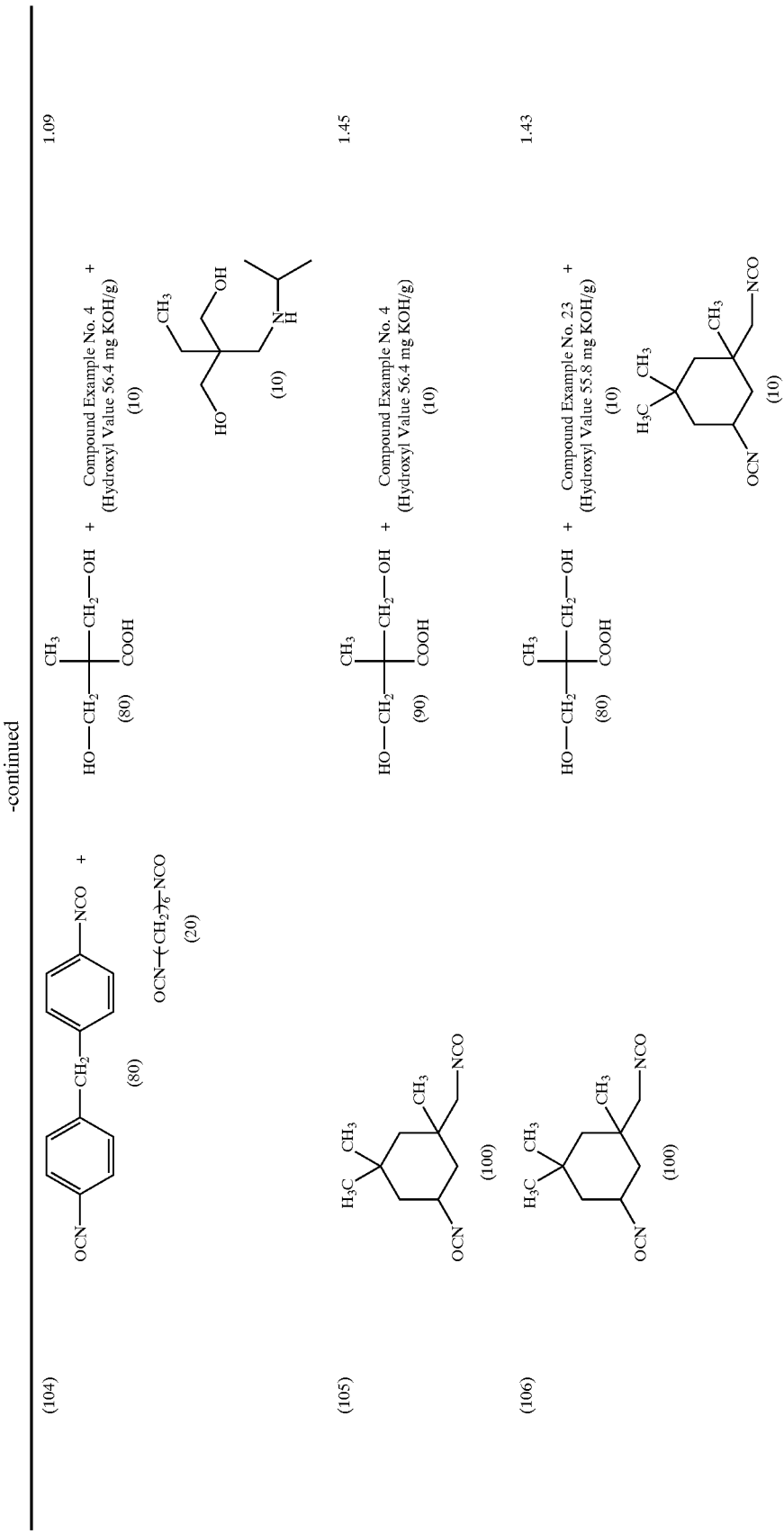

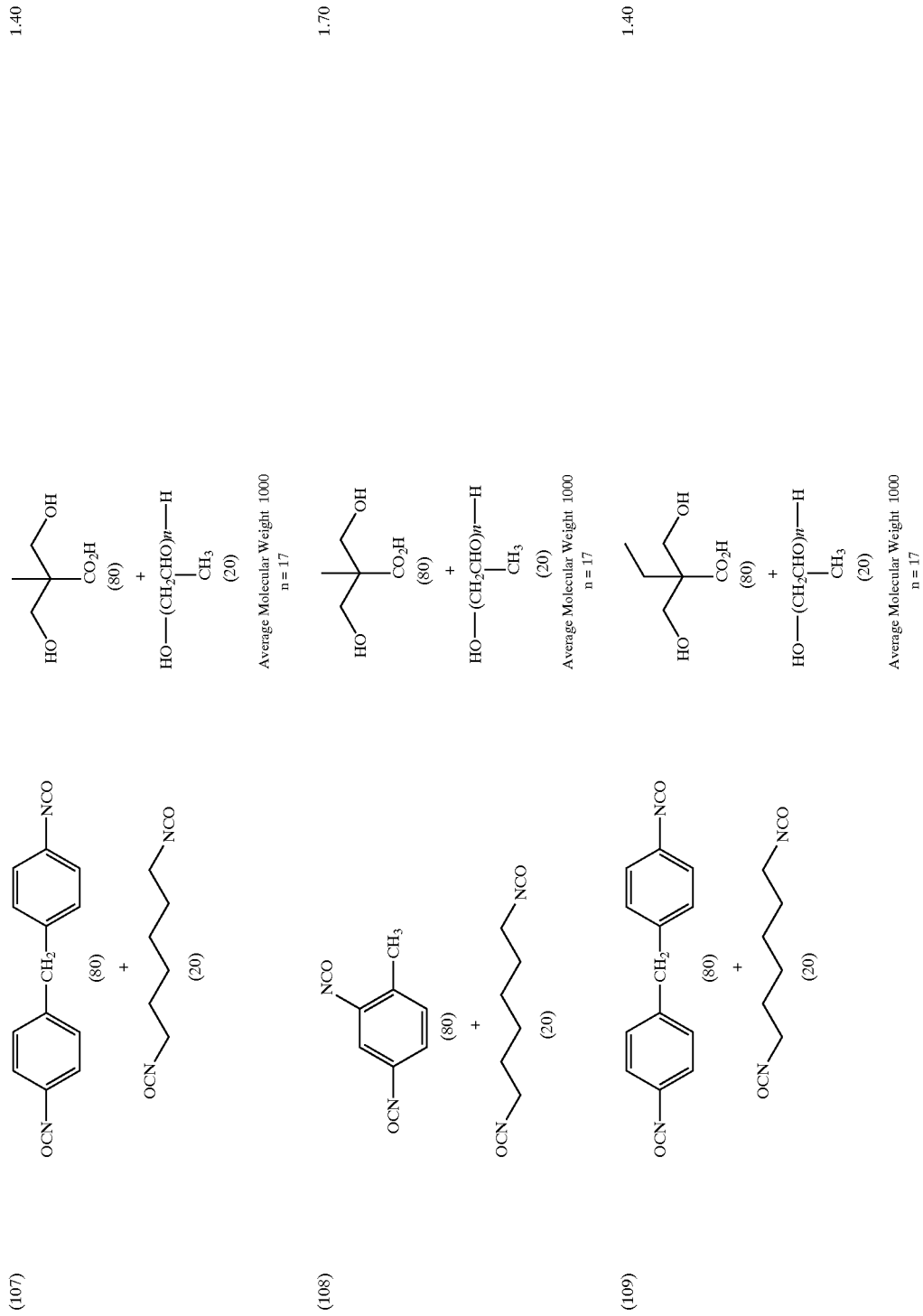

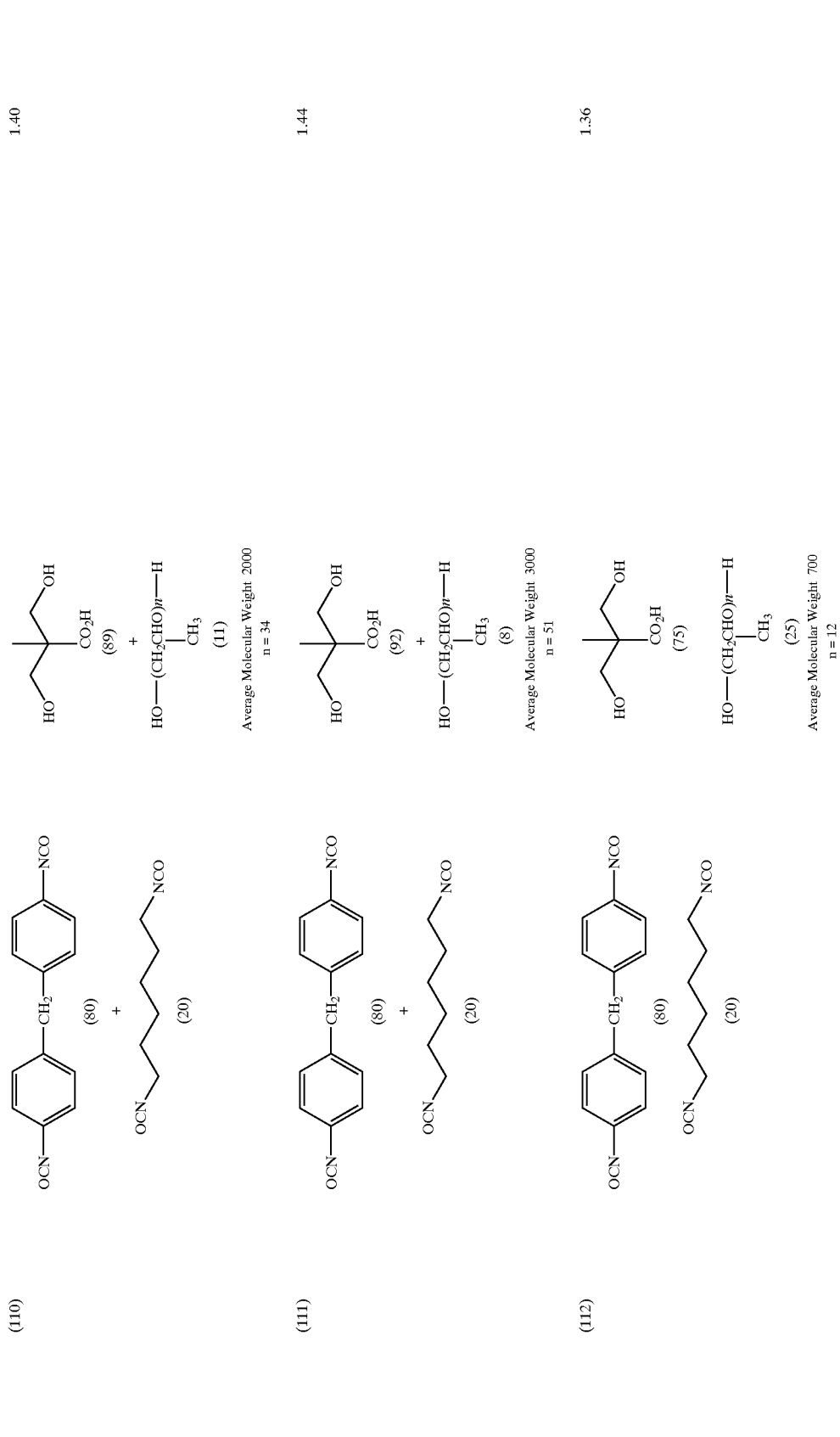

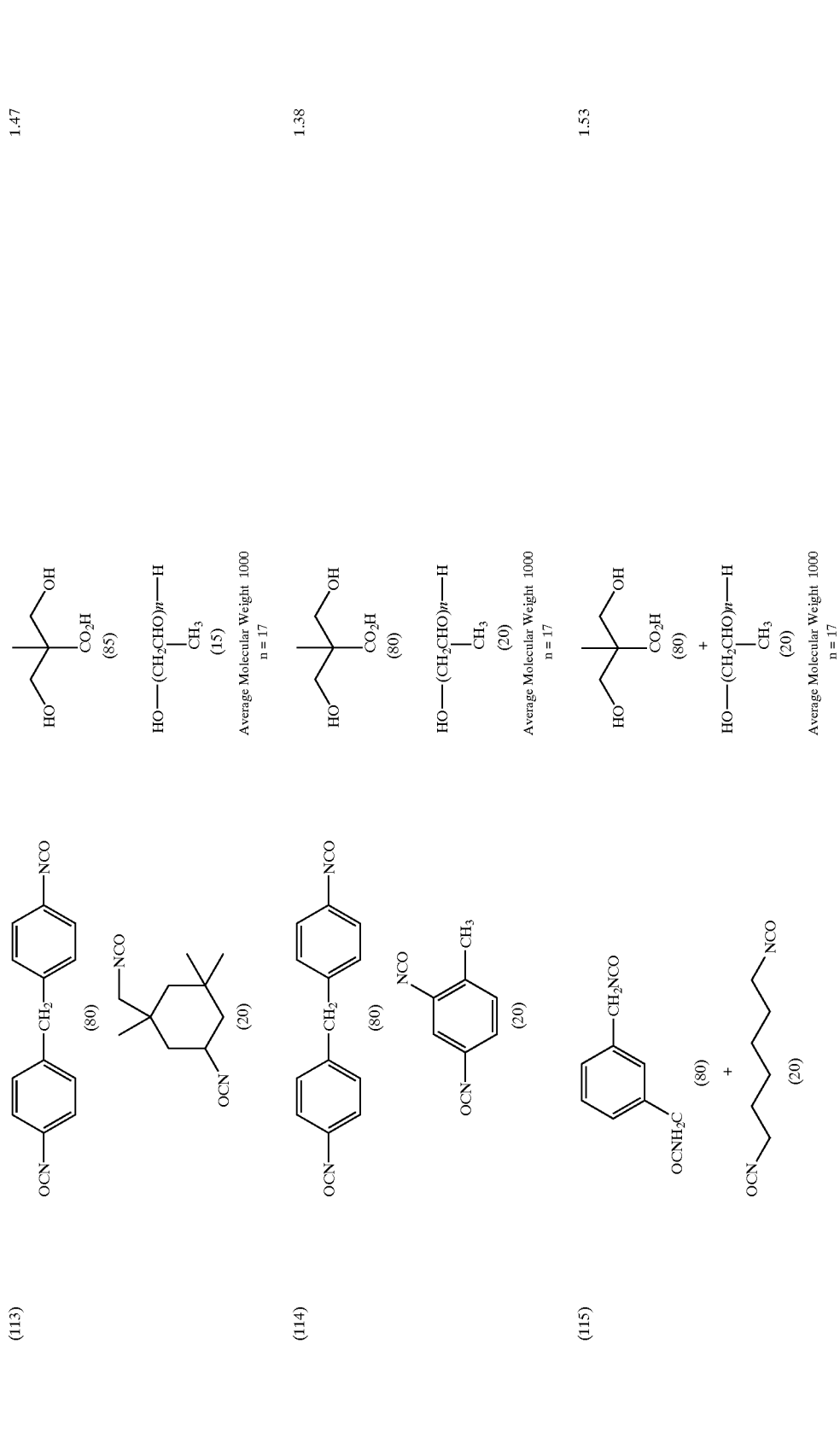

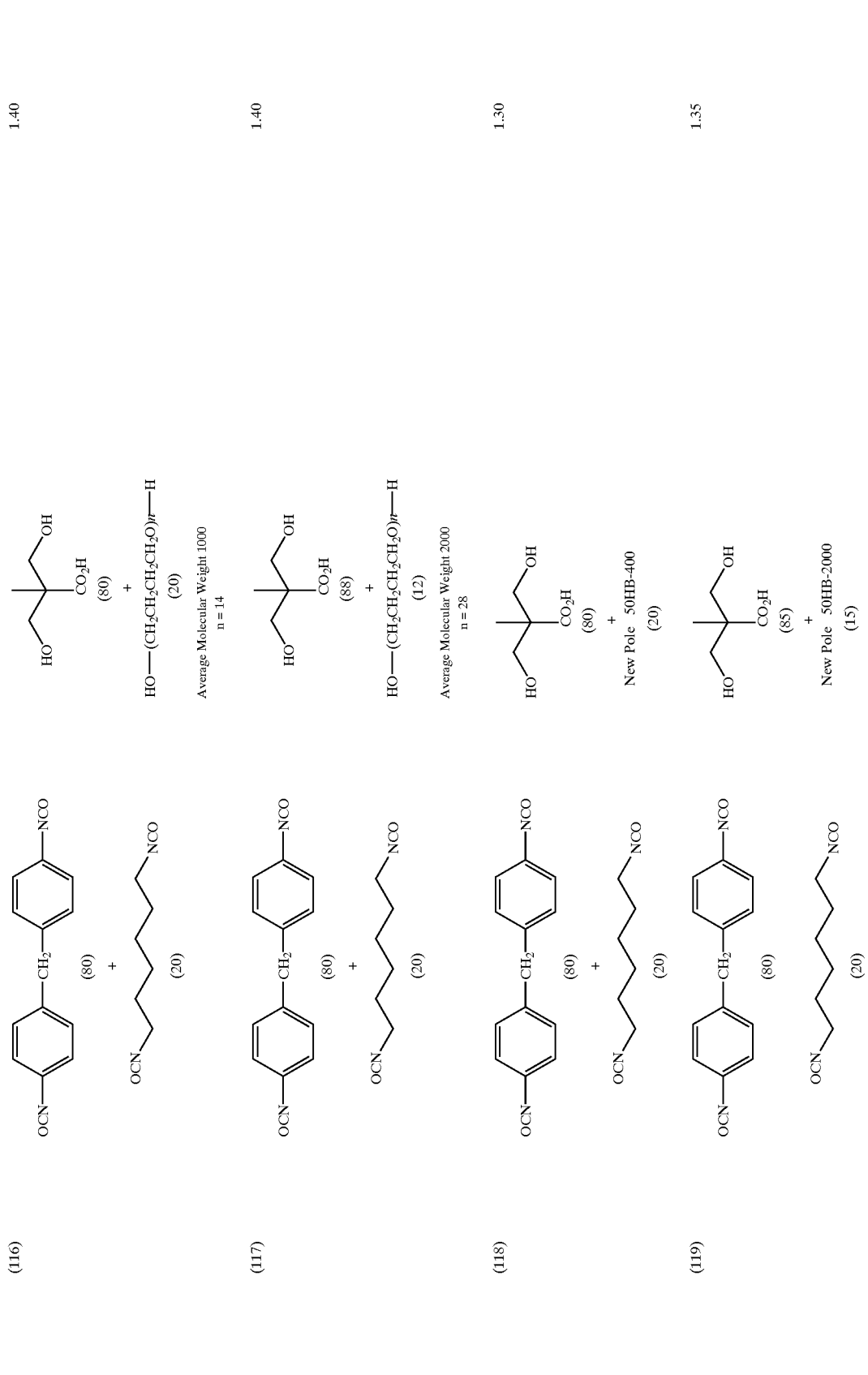

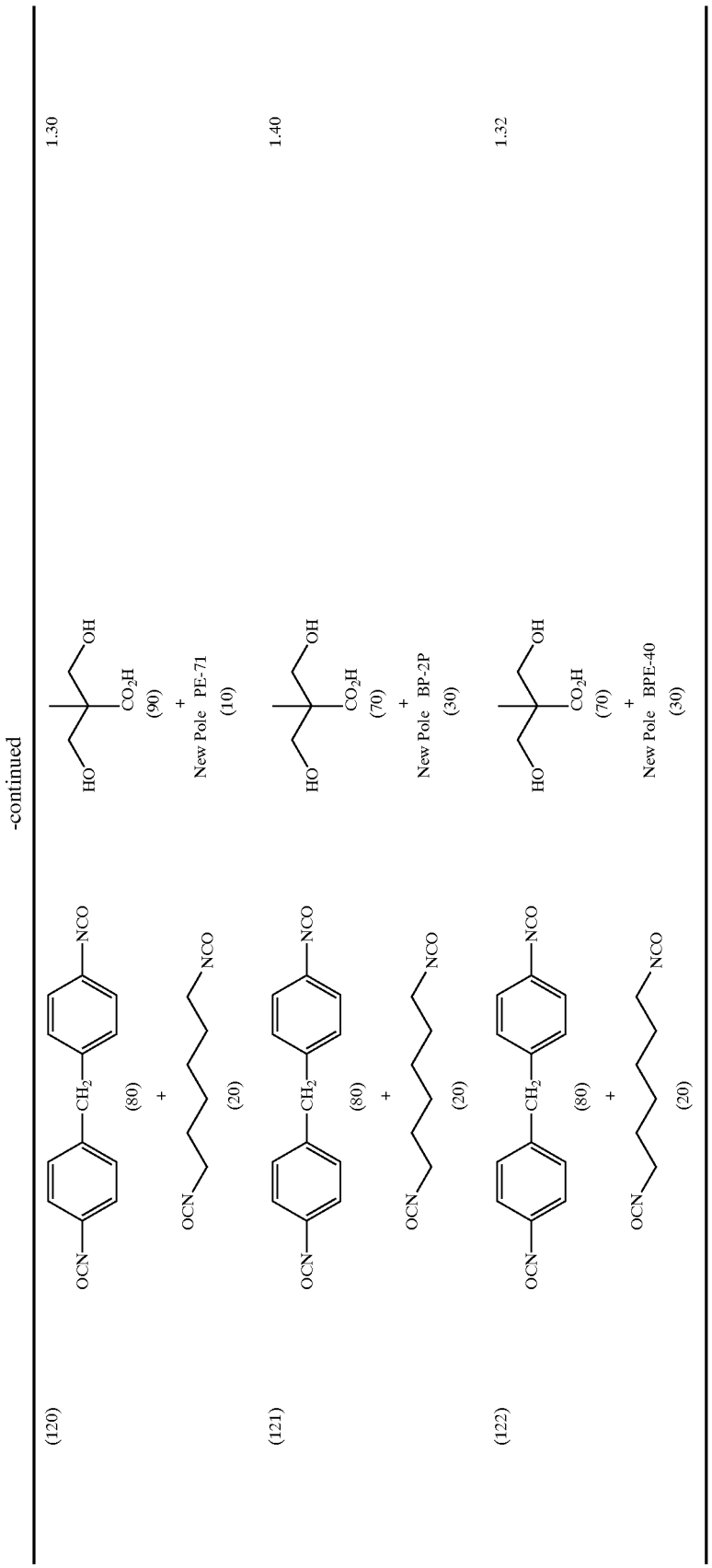

Radical-reactive groups may be introduced into side chains on these polyurethane resin binders to thus improve the strength of the resulting cured film. Examples of such reactive groups are ethylenically unsaturated bond-containing groups, amino groups and epoxy groups as addition polymerizable functional groups; mercapto groups, thiol groups, halogen atoms, triazine structures and onium salt structures as functional groups capable of being converted into radicals through irradiation with light rays; and carboxyl groups and imide groups as polar groups. The foregoing addition polymerizable functional groups are particularly preferably ethylenically unsaturated bond-containing groups such as acryl, methacryl, allyl and styryl groups and useful such functional groups may likewise be selected from the group consisting of amino groups, hydroxyl group, phosphonic acid residues, phosphoric acid residues, carbamoyl groups, isocyanate groups, ureide groups, ureylene groups, sulfonic acid residues and ammonio groups.

To maintain the developing ability of the composition, the polyurethane resin binder preferably has an appropriate molecular weight and an appropriate acid value. More specifically, effectively used herein are polyurethane resin binders each having a weight average molecular weight ranging from 5000 to 300,000.

These polyurethane resin binders may be mixed in the composition in an arbitrary amount based on the total amount of the composition. However, if the amount thereof exceeds 90% by weight, images finally formed on the printing plate are insufficient in, for instance, the strength. Accordingly, the amount thereof preferably ranges from 10 to 90% by weight and more preferably 30 to 80% by weight. Moreover, the ratio (by weight) of the photopolymerizable ethylenically unsaturated compound to the polyurethane resin binder preferably ranges from 1/9 to 9/1, more preferably 2/8 to 8/2 and particularly preferably 3/7 to 7/3.

In addition to the foregoing basic components, it is desirable that a small amount of a thermal polymerization inhibitor is added to the light-sensitive composition in order to prevent the occurrence of any unnecessary thermal polymerization of the polymerizable ethylenically unsaturated compound present therein during preparing or storing the light-sensitive composition. Examples of thermal polymerization inhibitors appropriately used in the invention are hydroquinone, p-methoxyphenol, di-t-butyl-p-cresol, pyrogallol, t-butyl catechol, benzoquinone, 4,4'-thiobis(3-methyl-6-t-butyl-phenol), 2,2'-methylenebis(4-methyl-6-t-butylphenol), cerium (I) salt of N-nitrosophenyl hydroxylamine and aluminum salt of N-nitrosophenyl hydroxylamine. The amount of the thermal polymerization inhibitor to be added to the composition preferably ranges from about 0.01 to about 5% by weight on the basis of the total weight of the composition. Moreover, for instance, a higher fatty acid derivative such as behenic acid or behenic acid amide is, if necessary, added to the composition so that the derivative is unevenly distributed on the surface of the light-sensitive layer during the process for drying the layer after the application thereof, in order to prevent any inhibition of the polymerization by oxygen. The amount of the higher fatty acid derivative to be added preferably ranges from about 0.5 to about 10% by weight on the basis of the total weight of the composition.

Moreover, a coloring agent may be added to the light-sensitive composition to color the light-sensitive layer. Examples of such coloring agents are pigments such as Phthalocyanine type pigments (for instance, C.I. Pigment Blue 15:3, 15:4 and 15:6), azo type pigments, carbon black and titanium oxide; and dyes such as Ethyl Violet, Crystal Violet, azo dyes, anthraquinone type dyes and cyanine type dyes. The amount of these dyes and pigments to be added to the composition preferably ranges from about 0.5 to about 20% by weight based on the total weight of the composition.

Moreover, the composition may further comprise an inorganic filler and/or other additives, for example, a plasticizer such as dioctyl phthalate, dimethyl phthalate and tricresyl phosphate, in order to improve the physical properties of the finally resulting cured film.

The amount of these additives to be added to the composition is preferably not more than 10% by weight based on the total weight of the composition.

When the light-sensitive composition for the presensitized plate for use in making a lithographic printing plate is applied onto the surface of a substrate, the composition is dissolved in a variety of organic solvent prior to the practical use thereof. Examples of such solvents usable herein are acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate-3-methoxy propyl acetate, N,N-dimethylformamide, dimethylsulfoxide, γ-butyrolactone, methyl lactate and ethyl lactate. These solvents may be used alone or in combination. In this connection, the concentration of the solid content present in the coating solution suitably ranges from 1 to 50% by weight.

A surfactant may be added to the photopolymerizable composition in the light-sensitive layer of the presensitized plate for use in making a lithographic printing plate, for the improvement of the quality of the coated surface.

The coated amount of the composition suitably ranges from about 0.1 $g/m^2$ to about 10 $g/m^2$ as expressed in terms of the weight after drying. The amount thereof more preferably ranges from 0.3 to 5 $g/m^2$ and further preferably 0.5 to 3 $g/m^2$.

In addition, a protective layer having oxygen-barrier properties is in general applied onto the surface of the foregoing light-sensitive layer to prevent any polymerization-inhibitory effect of oxygen.

The oxygen-barrier protective layer comprises a water-soluble vinyl polymer and the water-soluble polymer may be, for instance, polyvinyl alcohol and partial esters, ethers and acetals thereof or copolymers thereof containing unsubstituted vinyl alcohol units in a substantial amount, which can impart desired water solubility thereto. Examples of polyvinyl alcohols are those, which are hydrolyzed at a rate ranging from 71 to 100% and have a degree of polymerization ranging from 300 to 2400. Specific examples thereof are PVA-105, PVA-110, PVA-117, PVA-117H, PVA-120, PVA-124, PVA-124H, PVA-CS, PVA-CST, PVA-HC, PVA-203, PVA-204, PVIA-205, PVA-210, PVA-217, PVA-220, PVA-224, PVA-217EE, PVA-220, PVA-224, PVA-217E, PVA-220E, PVA-224E, PVA-405, PVA-420, PVA-613 and L-8 available from Kuraray Co., Ltd. The foregoing copolymer may be, for instance, polyvinyl acetate chloroacetate or propionate, polyvinyl formal and polyvinyl acetal and copolymers thereof, which are hydrolyzed at a rate ranging from 88 to 100%. Other useful polymers also include, for instance, polyvinyl pyrrolidone, gelatin and gum Arabic, which may be used alone or in combination. It is also preferred to incorporate, into the protective layer, a copolymer of vinyl pyrrolidone with vinyl acetate or a copolymer of vinyl pyrrolidone with vinyl acetate, which is saponified to some extent with an alkali.

As a solvent used for the application of the oxygen-barrier protective layer for the presensitized plate for use in making a lithographic printing plate, pure water is preferred, but an alcohol such as methanol or ethanol or a ketone such as acetone or methyl ethyl ketone may be mixed with pure water. The solid content in the coating solution thus prepared suitably ranges from 1 to 20% by weight.

To the foregoing oxygen-barrier protective layer, there may further be added known additives such as a surfactant for the improvement of the coating properties of the coating solution and/or a water-soluble plasticizer for the improvement of the physical properties of the resulting film.

Examples of such water-soluble plasticizers are propionamide, cyclohexane diol, glycerin and sorbitol. Moreover, a water-soluble (meth) acrylic polymer or the like may likewise be added to the protective layer.

The coated amount of the protective layer suitably ranges from about 0.1 $g/m^2$ to about 15 $g/m^2$ and more preferably 1.0 $g/m^2$ to 5.0 $g/m^2$.

Then the substrate for the presensitized plate of use in making a lithographic printing plate will hereunder be detailed.

The aluminum substrate herein used means a dimensionally stable plate of aluminum or alloys thereof (such as alloys of aluminum with, for instance, silicon, copper, manganese, magnesium, chromium, zinc, lead, bismuth and nickel), or plastic films or paper on which aluminum or an aluminum alloy is laminated or vapor-deposited and the thickness thereof in general ranges from about 0.05 to 1 mm. In addition, it is also possible to use composite sheets disclosed in J.P. KOKAI No. Sho 48-18327.

The aluminum substrate may appropriately be subjected to a surface treatment as will be detailed below.

(Graining Treatment)

Methods for graining include, for instance, mechanical graining, chemical etching and electrolytic graining as disclosed in J.P. KOKAI No. Sho 56-28893. Examples of graining methods usable herein further include electrochemical graining methods in which an aluminum substrate is electrochemically grained in hydrochloric acid or nitric acid as an electrolyte, and mechanical graining methods such as wire brush-graining methods wherein the surface of an aluminum substrate is scratched with metal wires, ball-graining methods in which the surface of an aluminum substrate is grained using abrasive spheres (balls) and an abrasive, and brush-graining methods in which the surface is grained with a nylon brush and an abrasive. These graining methods may be used alone or in any combination.

Among these, the surface-roughening method particularly conveniently used in the present invention is the electrochemical graining method in which an aluminum substrate is electrochemically grained in hydrochloric acid or nitric acid as an electrolyte. In this connection, the current density suitably used herein ranges from 100 $C/dm^2$ to 400 $C/dm^2$. More specifically, the aluminum substrate is preferably electrolyzed in an electrolyte containing hydrochloric acid or nitric acid in a concentration ranging from 0.1 to 50% under the following conditions: a temperature ranging from 20 to 100° C., an electrolyzation time ranging from one second to 30 minutes and a current density ranging from 100 $C/dm^2$ to 400 $C/dm^2$.

The aluminum substrate thus surface-grained is then chemically etched with an acid or an alkali. If an acid is used as an etching agent, it takes a long period of time to break the fine structures and therefore, the use of an acid is unfavorable from the industrial standpoint, but this problem can be solved by the use of an alkali as an etching agent.

Examples of alkaline agents suitably used in the present invention are sodium hydroxide, sodium carbonate, sodium aluminate, sodium metasilicate, sodium phosphate, potassium hydroxide or lithium hydroxide and the concentration thereof and the temperature of the resulting etching solution preferably range from 1 to 50% and 20 to 100° C., respectively and preferred conditions are such that the amount of Al dissolved falls within the range of from 5 to 20 $g/m^3$.

After the etching treatment, the aluminum substrate is washed with an acid to remove the contaminants (smut) remaining on the surface thereof. The acid used in the acid washing is, for instance, nitric acid, sulfuric acid, phosphoric acid, chromic acid, hydrogen fluoride, and tetrafluoroboric acid. In particular, preferred methods for removing smut after the electrochemical surface-roughening treatment are, for instance, a method as disclosed in J.P. KOKAI No. Sho 53-12739, in which the aluminum substrate is brought into contact with 15 to 65% by weight sulfuric acid at a temperature ranging from 50 to 90° C. and an alkali etching method disclosed in J.P. KOKOKU No. Sho 48-28123.

In this respect, the surface roughness (Ra) of the Al substrate effectively used in the present invention ranges from 0.3 to 0.7 $\mu$m.

(Anodization Treatment)

The aluminum substrate thus treated is further anodized.

The Anodization may be carried out according to the method currently used in this field. More specifically, a direct current or an alternating current can be passed through the aluminum substrate in an aqueous or non-aqueous solution containing sulfuric acid, phosphoric acid, chromic acid, oxalic acid, sulfamic acid or benzenesulfonic acid or a combination of at least two of them to thus form an anodized film on the surface of the aluminum substrate.

The conditions for the anodization variously vary depending on the electrolyte used and cannot unconditionally be specified, but it is generally suitable to use the following conditions: an electrolyte concentration ranging from 1 to 80%, an electrolyte temperature ranging from 5 to 70° C., a current density ranging from 0.5 to 60 $A/dm^2$, a voltage ranging from 1 to 100 V, and an electrolyzation time ranging from 10 to 100 seconds.

Among these anodization treatments, particularly preferred are the anodization method disclosed in G.B. Patent No. 1,412,768 in which an aluminum substrate is anodized in a sulfuric acid solution at a high current density and the anodization method disclosed in U.S. Pat. No. 3,511,661 in which a phosphoric acid solution is used as an electrolytic bath.

In the anodization treatment used in the present invention, the anodized film preferably amounts to the range of from 1 to 10 $g/m^2$. If the amount of the film is not more than 1 $g/m^2$, the resulting plate is liable to form defects, while if it is not less than 10 $g/m^2$, a large quantity of electric power is required to produce the same and it is not economically favorable. Therefore, the amount of the film preferably ranges from 1.5 to 7 $g/m^2$ and more preferably 2 to 5 $g/m^2$.

After the graining and anodization treatments, the aluminum substrate may be subjected to a sealing treatment. Such sealing treatment is carried out, for instance, by immersing the substrate in hot water or a hot aqueous solution containing an inorganic or organic salt or by the treatment with a steam bath. Moreover, the aluminum substrate may further be subjected to a surface-treatment other than the silicate treatment using an alkali metal silicate, such as immersion of the substrate in an aqueous solution of, for instance, potassium fluorozirconate or a phosphoric acid salt.

A light-sensitive layer consisting of the foregoing photopolymerizable composition is formed on the aluminum substrate, which had been surface-treated according to the foregoing method to thus form a presensitized plate for use in making a lithographic printing plate. At this stage, an organic or inorganic subcoating layer may be applied onto the substrate prior to the application of the light-sensitive layer in order to improve the adhesive properties of image areas and to improve the developing ability of non-image areas.

The light-sensitive layer of the presensitized plate for use in making a lithographic printing plate is imagewise exposed to conventionally known actinic light rays emitted from, for instance, a carbon arc lamp, a high pressure mercury lamp, a xenon lamp, a metal halide lamp, a fluorescent lamp, a tungsten lamp, a halogen lamp, an He—Cd laser, an Ar ion laser, an FD-YAG laser, an He—Ne laser and a semiconductor laser (wavelength ranging from 350 nm to 600 nm) and then developed to thus form desired images on the surface of the aluminum substrate.

The light-sensitive layer may be heated at a temperature ranging from 50 to 200° C. for one second to 5 minutes after the imagewise exposure of the layer and before the development thereof in order to improve the curing rate of the photopolymerizable light-sensitive layer.

In addition, the presensitized plate for use in making a lithographic printing plate is in general provided thereon with an overcoat layer having oxygen barrier properties as has been discussed above. Therefore, there have been known, as methods for developing such a printing plate, a method in which the overcoat layer is removed simultaneously with the removal of the unexposed areas on the light-sensitive layer using a developer and a method in which the overcoat layer is first removed using water or warm water and then the unexposed areas on the light-sensitive layer is removed through development. These water and warm water may further comprise, for instance, preservatives or the like disclosed in J.P. KOKAI No. Hei 10-10754 and organic solvents or the like disclosed in J.P. KOKAI No. Hei 8-278636.

The presensitized plate for use in making a lithographic printing plate used in the present invention is developed with the foregoing developer at a temperature ranging from about 0 to 60° C. and preferably about 15 to 40° C., for instance, the imagewise exposed presensitized plate is immersed in a developer, while rubbing the plate with a brush.

Moreover, if the imagewise exposed plate is developed using an automatic developing machine, the developer is exhausted depending on the number of processed plates and therefore, the processing capacity of the developer may be restored using a replenisher or a fresh developer.

The presensitized plate for use in making a lithographic printing plate thus developed is subjected to post-treatments, for instance, with washing water, a rinsing solution containing a surfactant and a desensitizing solution containing, for instance, gum Arabic and a starch derivative, as disclosed in, for instance, J.P. KOKAI Nos. Sho 54-8002, Sho 55-115045 and Sho 59-58431. In the post-treatment of the presensitized plate, these treatments may variously be combined and used.

The printing plate prepared after the foregoing treatments may be subjected to a post-exposure treatment and/or a heat treatment such as burning according to the methods disclosed in J.P. KOKAI 2000-89478 to thus improve the printing durability of the plate.

The lithographic printing plate thus obtained is fitted to an offset printing machine to form a large number of printed matters.

EXAMPLES

The present invention will hereunder be described in more detail with reference to the following Preparation Examples, Examples and Comparative Examples, but the present invention is not restricted to the content of these specific Examples at all.

Synthetic Example 1

Polyurethane Resin (90)

To a 500 ml volume three necked round flask equipped with a condenser and a stirring machine, there were added 12.1 g (0.09 mole) of 2,2-bis(hydroxymethyl)propionic acid and 20.0 g (0.01 mole) of a diol compound or the compound No. 5 (hydroxyl group value: 56.9 mg KOH/g) and they were dissolved in 100 ml of N,N-dimethyl acetamide. To the resulting solution, there were added 20.0 g (0.08 mole) of 4,4'-diphenylmethane diisocyanate and 3.4 g (0.02 mole) of hexamethylene diisocyanate and the resulting mixture was heated with stirring at 100° C. for 5 hours. Thereafter, the mixture was diluted with 200 ml of N,N-dimethylformamide and 400 ml of methyl alcohol. The reaction solution was poured into 4 liters of water with stirring to thus precipitate a white polymer. The polymer was filtered off, washed with water and then dried under a vacuum to give 45 g of the foregoing polymer.

The molecular weight of the resulting polymer was determined by the gel permeation chromatography (GPC) and thus, the weight average molecular weight (polystyrene standard) was found to be 50,000. Moreover, the content of carboxyl groups (acid value) was determined by the titration technique and it was found to be 1.40 meq/g.

Synthetic Example 2

Polyurethane Resin (91)

There were dissolved, in 100 ml of N,N-dimethyl acetamide, 18.1 g (0.14 mole) of 2,2-bis(hydroxymethyl) propionic acid and 30.0 g (0.02 mole) of a diol compound or the compound No. 5 (hydroxyl group value: 56.9 mg KOH/g) and then the same procedures used in Preparation Example 1 were repeated except for using 38.0 g (0.16 mole) of 4,4'-diphenylmethane diisocyanate to thus carry out the treatments after the reaction. Thus, 80 g of the title compound was obtained as a white polymer. The molecular weight of the resulting polymer was determined by GPC and as a result, the weight average molecular weight (polystyrene standard) was found to be 200,000. Moreover, the content of carboxyl groups (acid value) was determined by the titration technique and it was found to be 1.30 meq/g.

Other polyurethane resins used in the following Examples could be synthesized using the foregoing diisocyanate compounds and diol compounds according to the same procedures used in Synthetic Examples 1 and 2.

Examples 1 to 10

A 1S aluminum plate having a thickness of 0.30 mm was grained using a No. 8 nylon brush and an aqueous suspension of 800 mesh pumice stone and then sufficiently washed with water. The surface-grained aluminum plate was etched by immersing the same in a 10% aqueous sodium hydroxide solution at 70° C. for 60 seconds, followed by washing with running water, neutralization and washing with a 20% $HNO_3$ solution and then washing with water. The aluminum plate thus treated was electrolytically surface-roughened in a 1% aqueous solution of nitric acid, at $V_A$=12.7 V such that the quantity of electricity at the anode time was 300 coulomb/$dm^2$, using a sinusoidal alternating waved current. The surface roughness of the resulting plate was determined and was found to be 0.45 μm (expressed in terms of Ra unit). Subsequently, the aluminum plate was desmutted by immersing the plate in a 30% aqueous sulfuric acid solution at 55° C. for 2 minutes, followed by anodization at a current density of 5A/$dm^2$ for 50 seconds at 33° C. in a 20% $H_2SO_4$ aqueous solution, while a cathode was arranged on the grained surface of the aluminum plate. As a result, the thickness of the anodized film was found to be 2.7 g/$m^2$.

A highly sensitive photopolymerizable composition having the following composition was applied onto the aluminum plate thus treated so that the coated amount (dried before weighing) was equal to 1.5 g/$m^2$ and then dried at 100° C. for one minute to (Photopolymerizable Composition 1)

| Component | Amt. (part by weight) |
|---|---|
| Ethylenically unsaturated bond-containing compound (the following compound A1) | 2.0 |
| Polyurethane resin binder (see the following Table 1) | 2.0 |
| Sensitizer (the following compound C1) | 0.2 |
| Photopolymerization initiator (the following compound D1) | 0.2 |
| Dispersion of ε-phthalocyanine (the following compound F1) | 0.02 |
| Fluorine atom-containing nonionic surfactant, MEGAFAC F176 (available from Dainippon Ink and Chemicals, Inc.) | 0.02 |
| Methyl ethyl ketone | 10.0 |
| Propylene glycol monomethyl ether acetate | 10.0 |

TABLE 1

| Examples | Polyurethane resin | Weight Average Molecular Weight (Mw) |
|---|---|---|
| 1 | 12 | 30,000 |
| 2 | 85 | 20,000 |
| 3 | 90 | 50,000 |
| 4 | 91 | 200,000 |
| 5 | 92 | 80,000 |
| 6 | 96 | 75,000 |
| 7 | 98 | 90,000 |
| 8 | 100 | 100,000 |
| 9 | 107 | 50,000 |
| 10 | 108 | 150,000 |

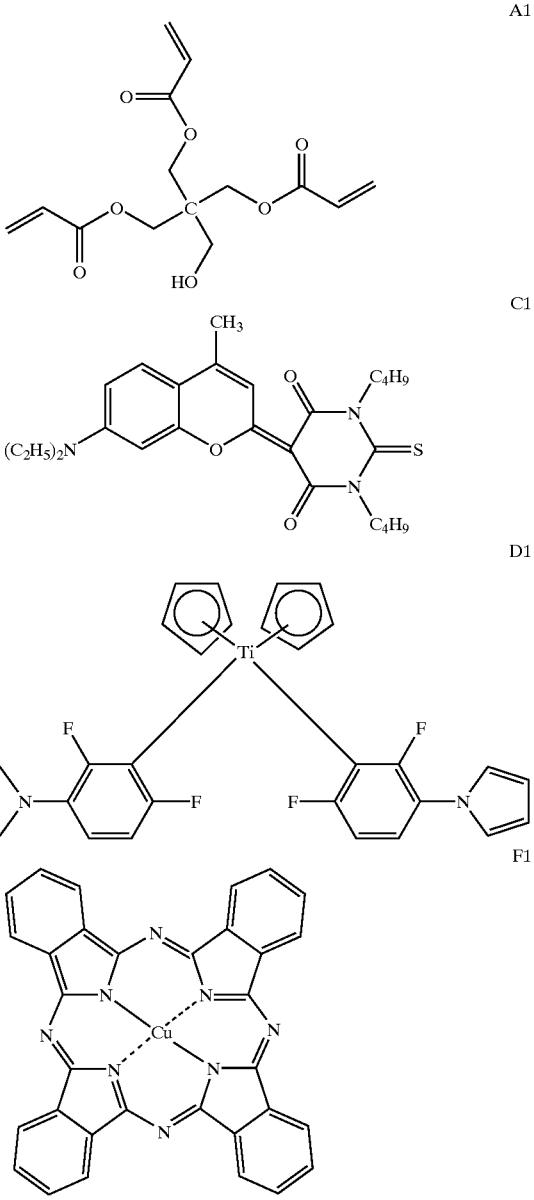

A 5% by weight aqueous solution of a polyvinyl alcohol (degree of saponification: 98 mole %, degree of polymerization: 500) was applied onto the surface of the light-sensitive layer so that the coated amount (weighed after drying) was equal to 2.5 g/$m^2$, followed by drying the coated layer at 120° C. for 2 minutes to give a presensitized plate for use in making a lithographic printing plate.

The resulting presensitized plate was subjected to scanning imagewise exposure at an exposure value of 300 μJ/$cm^2$, 1000 dpi and 100 lines/in using an FD-YAG laser (532 nm, PLATE JET 4 available from CSI Company) so as to form solid images and 2 to 98% half-tone dot images and then the imagewise exposed plate was subjected to the standard processing in an automatic developing machine (FLP82News available from Technigraph Company, developing speed: 1.2 m/min, charged amount of the developer: 5 L, equipped with a mechanism for removing the oxygen-barrier layer through water washing after pre-heating) to which the following developer 1 and a finishing gumming solution FP-2W (available from Fuji Photo Film Co., Ltd.) diluted 4 times with water had been charged. The pre-heating conditions of the automatic developing machine were as follows: temperature at the plate surface: 125° C., temperature of the developer: 25° C. and immersion time of the plate in the developer: 20 seconds.

The developer 1 had the following composition, a pH value of 11.8 as determined at 25° C. and an electrical conductivity of 5 mS/cm.

(Composition of Developer 1)

| Component | Amt. (g) |
|---|---|
| Potassium hydroxide (48%) | 0.12 |
| Polyoxyethylene phenyl ether (n = 13) | 5.0 |
| CHELEST 400 (a chelating agent, tetra-sodium ethylenediaminetetraacetate) | 0.2 |

The foregoing components were dissolved in water so that the total amount of the resulting solution was equal to 100 g.

Examples 11 to 14

A developer was prepared by substituting the composition thereof (unit: gram) shown in the following Table 2 for that of the developer 1 used in Example 9. More specifically, the components were dissolved in water so that the total amount of the resulting solution was equal to 100 g. The same procedures used in Example 9 were repeated except for using the foregoing developer to thus prepare each corresponding lithographic printing plate.

TABLE 2

| Composition | Examples | | | |
|---|---|---|---|---|
| | 11 | 12 | 13 | 14 |
| KOH (48%) | 0.12 | 0.12 | 0.12 | 0.20 |
| Polyoxyethylene methylphenyl ether (n = 10) | 5.00 | — | — | — |
| Polyoxyethylene naphtyl ether (n = 10) | — | 5.00 | — | 5.00 |
| Polyoxyethylene phenyl ether (n = 12) | — | — | 5.00 | — |
| Triethanol amine | — | — | 1.50 | — |
| ANONE LG (see the following formula) | — | — | — | 1.00 |
| CHELEST 400 | 0.10 | 0.10 | 0.10 | 0.10 |
| p-t-Butylbenzoic acid | — | — | — | 1.00 |
| PH | 11.8 | 11.8 | 11.9 | 12.3 |
| Electric conductivity (mS/cm) | 5.0 | 5.0 | 6.0 | 8.0 |

ANONE LG

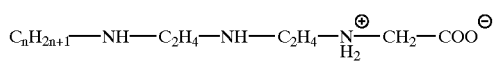

(In the foregoing formula, n≈8~14).

Example 15

The same procedures used in Example 9 were repeated except that the ethylenically unsaturated compound A1 in the photopolymerizable composition used in Example 9 was replaced with a compound having the following structure A2 to thus prepare a lithographic printing plate.

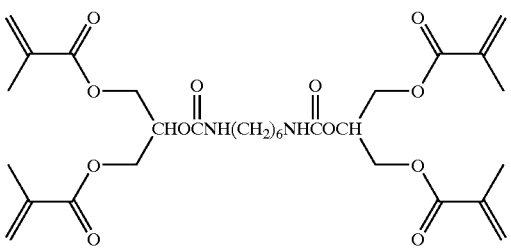

Example 16

The following components for a liquid subcoating composition were mixed and stirred at 30 ° C. After about 5 minutes, heat evolution was observed. After continuing the reaction for 60 minutes, the content of the reactor was transferred to another container and then 30,000 parts by weight of methanol was added thereto to give a coating liquid.

(Liquid Subcoating Composition)

| Component | Amt. (part by weight) |
|---|---|
| PHOSMER PE8 available from Unichemical Co., Ltd. | 20 |
| Methanol | 130 |
| Water | 20 |
| p-Toluenesulfonic acid | 5 |
| Tetraethoxy silane | 50 |
| 3-Methacryloxy propyl trimethoxy silane | 50 |

This coating liquid was applied onto the anodized aluminum substrate prepared in Example 5 so that the amount of Si was equal to about 0.003 g/m$^2$ and dried at 100° C. for one minute, followed by the formation of a light-sensitive layer and a layer of a water-soluble resin, imagewise exposure and development according to the same procedures used in Example 1 to thus prepare a lithographic printing plate.

Comparative Example 1

The same procedures used in Example 9 were repeated except that the polyoxyethylene phenyl ether was removed from the developer 1 used in Example 9 to form a developer (pH 11.8, electrical conductivity 5 mS/cm) to thus prepare a lithographic printing plate.

Comparative Example 2

A developer was prepared by using the same composition and amounts of components used for the developer 1 of Example 9 except for changing the added amount of the potassium hydroxide solution (48%) to 1.0 g. The resulting developer had a pH value of 13.0 and an electrical conductivity of 25 mS/cm. The same procedures used in Example 9 were repeated except for using the foregoing developer to thus prepare a lithographic printing plate.

Comparative Example 3

The same procedures used in Example 9 were repeated except for using a developer prepared by diluting DV-1 developer available from Fuji Photo Film Co., Ltd. as an alkali metal silicate-containing developer 10 times with water instead of the developer 1 used in Example 9 to thus prepare a lithographic printing plate. In this respect, the developer had a pH value of 12.8 and an electrical conductivity of 32 mS/cm.

The lithographic printing plates prepared according to the plate-making methods disclosed in the foregoing Examples 1 to 16 and Comparative Examples 1 to 3 were inspected for the developing ability, printing durability, scumming of non-image areas, blinding and sludge during development. The developing ability was judged on the basis of the presence of remaining residue of sensitive layer and the degree of the residue by visually observing the plate surface carrying half-tone dot images on the non-image area after the development. The properties of these plates were evaluated using a newspaper rotary press available from Tokyo Kikai Seisakusho Ltd. and SUMI ink for newspaper available from Dainippon Ink and Chemicals, Inc. The printing durability was evaluated on the basis of the number of printed matters obtained till the solid images were skipped over. The scumming was evaluated on the basis of the crossing or overlapping of the nonimage areas and/or half-tone dot images on printed matters. The blinding was evaluated by preparing 20,000 printed matters, discontinuing the printing operation for one hour and determining the ink adhesion to the printing plate at the resumption of the printing operation. Moreover, the sludge during development was evaluated by developing 500 $m^2$ of a printing plate, removing the developer from the automatic developing machine FLP82News and observing the degree of sludge with the naked eyes.

TABLE 3

| Example No. | Developing Ability | Printing Durability | Scumming | Blinding | Sludge |
|---|---|---|---|---|---|
| 1 | Favorable | 160,000 | None | No Problem | None |
| 2 | Favorable | 180,000 | None | No Problem | None |
| 3 | Favorable | 200,000 | None | No Problem | None |
| 4 | Favorable | 220,000 | None | No Problem | None |
| 5 | Favorable | 200,000 | None | No Problem | None |
| 6 | Favorable | 180,000 | None | No Problem | None |
| 7 | Favorable | 240,000 | None | No Problem | None |
| 8 | Favorable | 200,000 | None | No Problem | None |
| 9 | Favorable | 240,000 | None | No Problem | None |
| 10 | Favorable | 180,000 | None | No Problem | None |
| 11 | Favorable | 240,000 | None | No Problem | None |
| 12 | Favorable | 240,000 | None | No Problem | None |
| 13 | Favorable | 240,000 | None | No Problem | None |
| 14 | Favorable | 220,000 | None | No Problem | None |
| 15 | Favorable | 260,000 | None | No Problem | None |
| 16 | Favorable | 250,000 | None | No Problem | None |
| Comparative Examples | | | | | |
| 1 | Remaining Residue | 240,000 | Quite | No Problem | Many |
| 2 | Remaining Residue | 50,000 | Slight | No Problem | None |
| 3 | Favorable | 80,000 | None | No Problem | None |

As has been clear from the data listed in Table 3, satisfactory results were obtained for each lithographic printing plate prepared according to the plate-making method of the present invention, but each comparative lithographic printing plate was insufficient in either of the results evaluated.

Example 17

After the presensitized plate prepared in Example 9 was imagewise exposed to light rays by a method similar to that used in Example 9, the imagewise exposed plate was pre- heated and washed with water to remove the oxygen-barrier layer in an FLP82News automatic developing machine. Thereafter, the plate was withdrawn from the automatic developing machine, a cellophane tape was adhered to the solid image area to thus protect the image area from any penetration of the developer, the nonimage area of the plate was then developed by inserting the plate into the developing bath of the automatic developing machine to thus form a lithographic printing plate. The printing durability of the resulting plate was evaluated according to the same method used in Example 9 and as a result, 250,000 sheets of acceptable printed matters were obtained. This clearly indicates that the image area is hardly damaged and the resulting printing plate has high printing durability when using the developer according to the present invention.

Comparative Example 4

A light-sensitive material was prepared using the same light-sensitive composition used in Example 1 except that methacrylic acid-methyl methacrylate (30:70) copolymer (Mw=50,000) was substituted for the polyurethane resin used in Example 1. The printing durability was evaluated by the same methods used in Examples 1 and 17 and it was found that the printing durability corresponded to the number of printed matters of 100,000 when the image area was not developed, while the printing durability was reduced to 30,000 after developing the image area.

Example 18

The presensitized plate prepared in Example 9 was allowed to stand in an environment maintained at 60° C. over one week. Then the plate was treated and evaluated by a method similar to that used in Example 9. As a result, the results similar to those observed in Example 9 were obtained or the plate was sufficient in all of the developing ability, scumming on the non-image areas, blinding and sludge during development. Moreover, the printing durability thereof was also found to be identical to that observed in Example 9 or it was equal to 240,000. These results clearly indicate that when using a presensitized plate and a developer according to the present invention, the plate can be developed without any trouble even if it is forced to store over a long period of time.

Effects of the Invention

As has been described above in detail, the method for preparing a lithographic printing plate according to the present invention exhibits excellent in the developing ability and permits the preparation of a lithographic printing plate free of any scumming on non-image areas and excellent in the printing durability, because of the use of a presensitized plate for use in making a lithographic printing plate having a polyurethane resin binder-containing photopolymerizable light-sensitive layer and a developer having a relatively low pH value and containing a nonionic surfactant having a specific structure. Moreover, the developer has a relatively low pH. Therefore, the present invention permits the achievement of such effects that the developer is excellent in safety and permits the minimization of the influence of the waste liquor of the developer on the environment.

What is claimed is:
1. A method for preparing a lithographic printing plate comprising the steps of subjecting, to imagewise exposure, a presensitized plate for use in making a lithographic printing plate comprising an aluminum substrate provided thereon with a light-sensitive layer formed from a photopo- lymerizable light-sensitive composition, which comprises a compound having an ethylenically unsaturated double bond, a photopolymerization initiator and a polyurethane resin binder and then developing the imagewise exposed plate with a developer containing an inorganic alkaline agent and a nonionic surfactant, carrying a polyoxyalkylene ether group, and having a pH value ranging from 10.0 to 12.5 and an electrical conductivity ranging from 3 to 30 mS/cm.

2. The method of claim 1 wherein the compound having an ethylenically unsaturated double bond is selected from the group consisting of those having at least one terminal ethylenically unsaturated double bond.

3. The method of claim 1 wherein the compound having an ethylenically unsaturated double bond is selected from esters of unsaturated carboxylic acids with aliphatic polyhydric alcohol compounds and amides of unsaturated carboxylic acids with aliphatic polyvalent amines.

4. The method of claim 1 wherein the photopolymerization initiator comprises a titanocene compound.

5. The method of claim 1 wherein the polyurethane resin binder contains carboxyl groups of not less than 0.4 meq/g.

6. The method of claim 5 wherein the polyurethane resin binder contains carboxyl groups in an amout ranging from 0.4 to 3.5 meq/g.

7. The method of claim 1 wherein the polyurethane resin binder has a molecular weight of not less than 1000 as expressed in terms of the weight average molecular weight.

8. The method of claim 7 wherein the polyurethane resin binder has a molecular weight of from 5000 to 500,000 as expressed in terms of the weight average molecular weight.

9. The method of claim 1 wherein the polyurethane resin binder has as a basic skeleton, a structural unit represented by a reaction product of at least one diisocyanate compound represented by the following general formula (1)' with at least one diol compound represented by the following general formula (1)":

OCN—Xo—NCO                 (1)'

HO—Yo—OH                    (1)"

(wherein Xo and Yo each represents a divalent organic group).

10. The method of claim 1 wherein the inorganic alkaline agent in the developer is selected from the group consisting of sodium tertiary phosphate, potassium tertiary phosphate, ammonium tertiary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide and lithium hydroxide.

11. The method of claim 1 wherein the nonionic surfactant in the developer is selected from a compound represented by the following formula (I):

$R^1$—O—$(R^2$—O$)_n$H                (I)

wherein $R^1$ represents an alkyl group having 3 to 15 carbon atoms, which may have a substituent, an aromatic hydrocarbon group having 6 to 15 carbon atoms, which may be substituted with a substituent, or a aromatic heterocyclic group having 4 to 15 carbon atoms, which may have a substituent, $R^2$ represents an alkylene group having 1 to 100 carbon atoms, which may have a substituent and n represents an integer ranging from 1 to 100.

* * * * *